US010739488B2

(12) United States Patent
Takahashi et al.

(10) Patent No.: US 10,739,488 B2
(45) Date of Patent: Aug. 11, 2020

(54) METAL DETECTION SENSOR AND METAL DETECTION METHOD USING SAME

(71) Applicant: EBARA CORPORATION, Tokyo (JP)

(72) Inventors: Taro Takahashi, Tokyo (JP); Mitsuo Tada, Tokyo (JP)

(73) Assignee: EBARA CORPORATION, Tokyo (JP)

(*) Notice: Subject to any disclaimer, the term of this patent is extended or adjusted under 35 U.S.C. 154(b) by 302 days.

(21) Appl. No.: 15/740,626

(22) PCT Filed: Jun. 23, 2016

(86) PCT No.: PCT/JP2016/068619
§ 371 (c)(1),
(2) Date: Sep. 25, 2018

(87) PCT Pub. No.: WO2017/002698
PCT Pub. Date: Jan. 5, 2017

(65) Prior Publication Data
US 2019/0011591 A1 Jan. 10, 2019

(30) Foreign Application Priority Data
Jun. 29, 2015 (JP) .................... 2015-130044

(51) Int. Cl.
*G01V 3/10* (2006.01)
*G01V 3/08* (2006.01)
(Continued)

(52) U.S. Cl.
CPC ............ *G01V 3/104* (2013.01); *G01N 27/82* (2013.01); *G01R 33/038* (2013.01); *G01R 33/34053* (2013.01); *G01V 3/081* (2013.01)

(58) Field of Classification Search
CPC .. G01V 3/104; G01V 3/081; G01R 33/34053; G01R 33/038; G01N 27/82
See application file for complete search history.

(56) References Cited

U.S. PATENT DOCUMENTS 4,866,383 A * 9/1989 Taliaferro ............ G01N 27/72
324/228
5,923,165 A * 7/1999 Horita ................. G01V 3/08
324/239
(Continued)

FOREIGN PATENT DOCUMENTS

JP   S59-052496 U   4/1984
JP   S63-210690 A   9/1988
(Continued)

OTHER PUBLICATIONS

International Patent Application No. PCT/JP2016/068619; Int'l Search Report; dated Aug. 30, 2016; 2 pages.

*Primary Examiner* — G. M. A Hyder
(74) *Attorney, Agent, or Firm* — BakerHostetler

(57) ABSTRACT

The object of the present invention is to provide a small-sized metal detection sensor for detecting fine metal contaminants, using an electromagnetic induction detection technique.

A metal detection sensor for 20 detecting metal 14 contained in an object under inspection moving through a passageway 18 comprises: magnets 24, 26 generating static magnetic field; and a coil 30 for detecting a magnetic field 28 generated by the metal 14. The magnets 24, 26 are located outside of the coil 30 along its axial direction, and the coil 30 is located outside of the magnets 24, 26 along the axial direction connecting the N poles and the S poles of the magnets 24, 26. The magnets 24, 26 are opposed to the coil 30.

24 Claims, 22 Drawing Sheets

(51) Int. Cl.
*G01N 27/82* (2006.01)
*G01R 33/038* (2006.01)
*G01R 33/34* (2006.01)

(56) References Cited

U.S. PATENT DOCUMENTS

| | | | |
|---|---|---|---|
| 2004/0046550 A1* | 3/2004 | Kondo | G01N 27/82 324/233 |
| 2005/0206373 A1 | 9/2005 | Kondo | |
| 2006/0122484 A1* | 6/2006 | Itozaki | G01R 33/441 600/409 |
| 2012/0268117 A1* | 10/2012 | Romano | G01N 24/084 324/307 |

FOREIGN PATENT DOCUMENTS

| | | |
|---|---|---|
| JP | 02-025789 A | 1/1990 |
| JP | 03-181879 A | 8/1991 |
| JP | H11-216383 A | 8/1999 |
| JP | 2003-080107 A | 3/2003 |
| JP | 2004-028708 A | 1/2004 |
| JP | 2004-085439 A | 3/2004 |
| JP | 2004-264266 A | 9/2004 |
| JP | 2005-083889 A | 3/2005 |
| JP | 2014-228522 A | 12/2014 |
| JP | 2015-034743 A | 2/2015 |
| JP | 2015-049224 A | 3/2015 |
| JP | 2015-059818 A | 3/2015 |
| WO | WO 2003/027659 A1 | 4/2003 |

* cited by examiner

Fig. 4
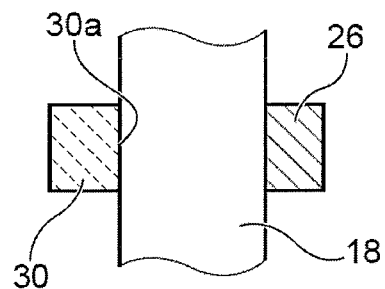
(a)
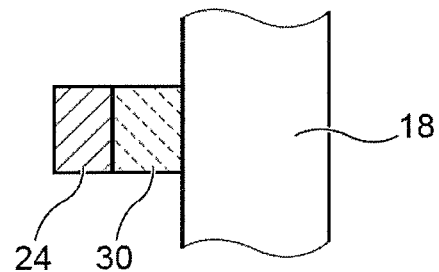
(b)
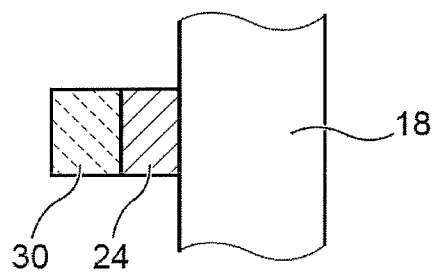
(c)
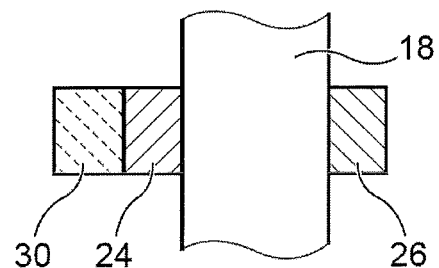
(d)
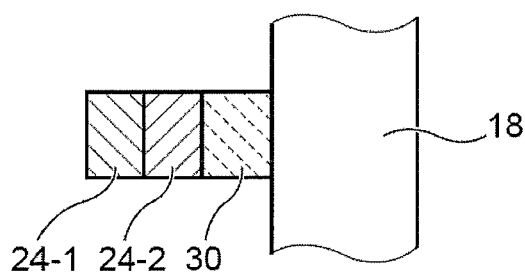
(e)
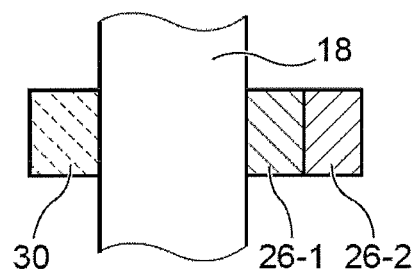
(f)

Fig. 8
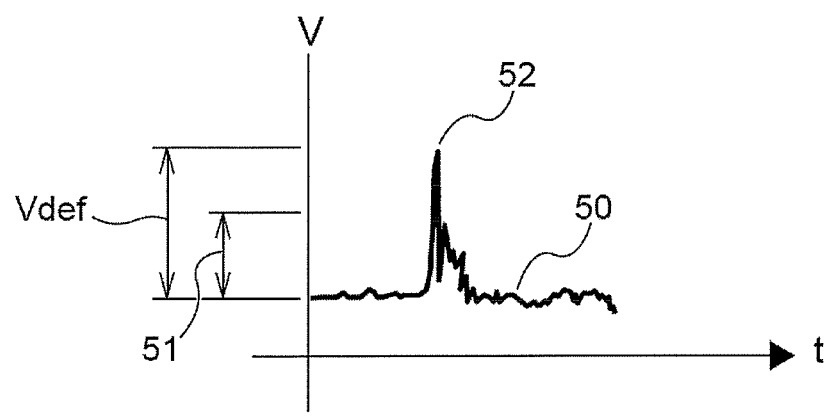
(a)
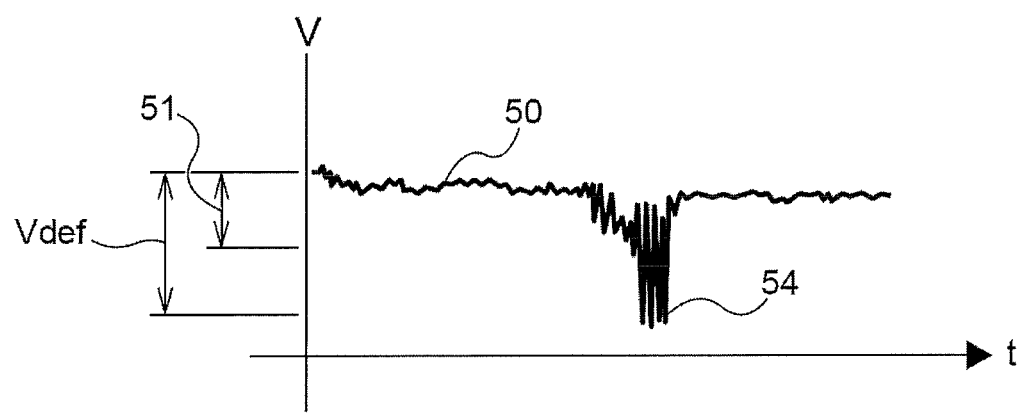
(b)

Fig. 21
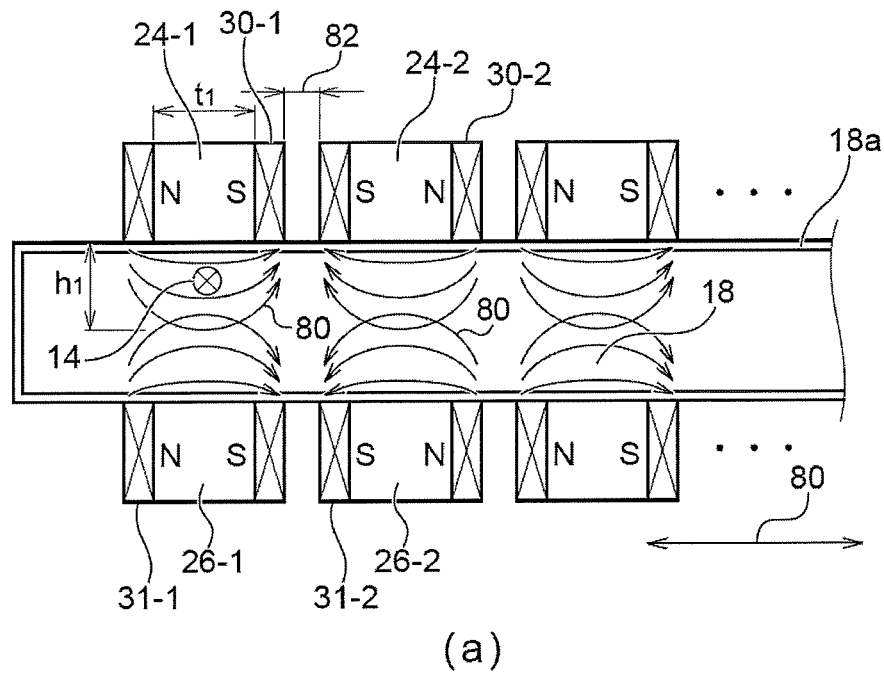
(a)
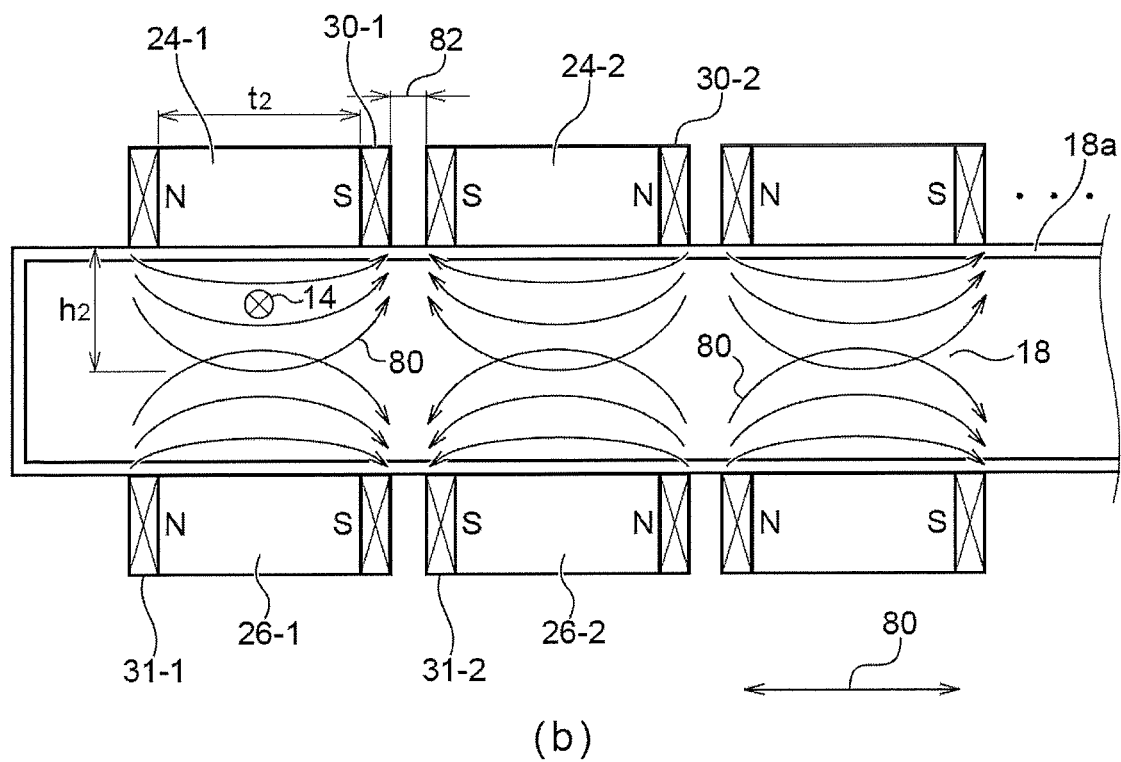
(b)

Fig. 22
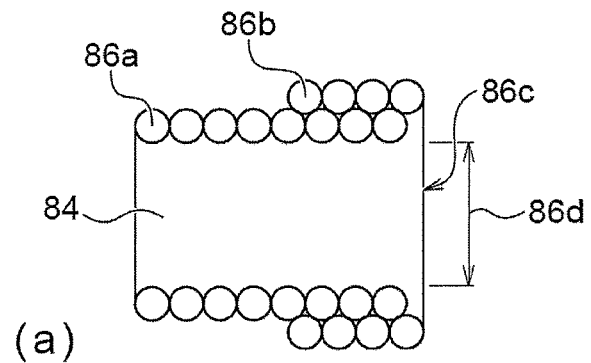
(a)
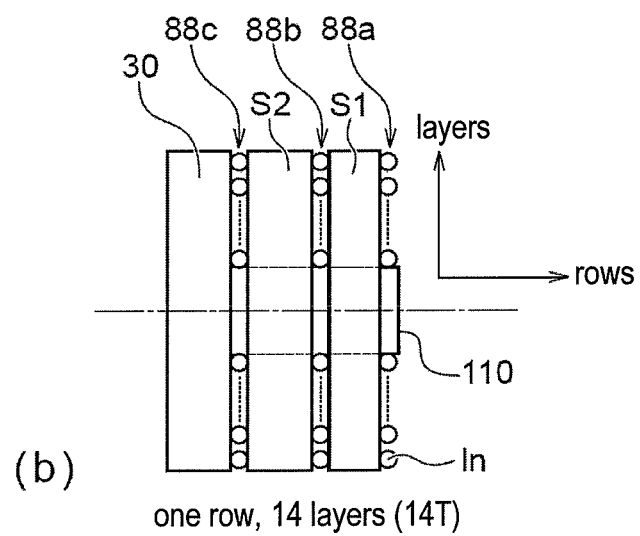
(b)
one row, 14 layers (14T)
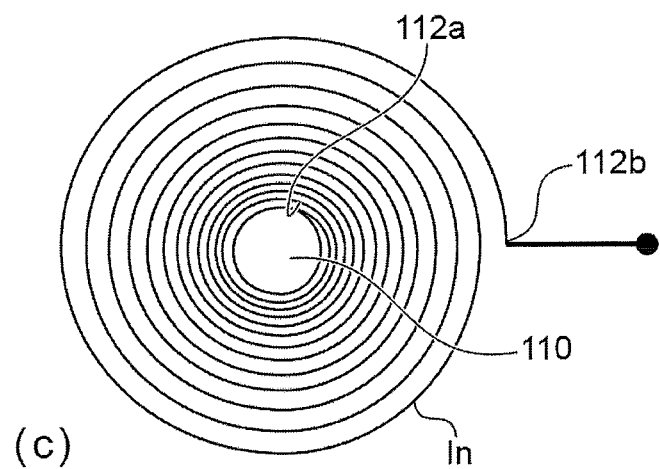
(c)

METAL DETECTION SENSOR AND METAL DETECTION METHOD USING SAME

CROSS-REFERENCE TO RELATED APPLICATIONS

This application is the national stage of International Application No. PCT/JP2016/068619 filed Jun. 23, 2016, which claims the benefit of Japanese Patent Applications No. JP 2015-130044, filed Jun. 29, 2015, the entirety of which are incorporated herein by reference.

TECHNICAL FIELD

The present invention relates to a sensor and a method for detecting metal contaminants mixed in pharmaceuticals, foodstuffs, industrial materials, and other electrically nonconductive materials. The present invention also relates to a sensor and a method for detecting a change in metal thickness, dimensions, or outer shape.

BACKGROUND ART

Conventionally, metal contaminants mixed in powder or the like of industrial materials, food, or the like, are detected, for example, by an electromagnetic induction detecting technique. This metal contaminant detection technique utilizes a change in magnetic field as an object under inspection passes through an alternating magnetic field generated by an excitation coil. Detection of a change in magnetic field by the detection coil indicates the presence of metal contaminant in the object. The excitation coil used for such an electromagnetic induction detection technique is normally a coil without an iron core.

Metal contaminants in powder are, in some cases, of the order of 0.1 mm to 70 micrometers in size. Conventionally, the detectable size of metal contaminants mixed in powder of nonconductive materials, such as foodstuffs, pharmaceuticals, resins, is up to about 0.5 mm for an electromagnetic induction technique. As such, conventional techniques for detecting metal contaminants have a problem of being incapable of detecting fine metal fragments.

This problem is caused by the low detection sensitivity of conventional excitation coils and detection coils used to measure metal contaminants. That is, since alternating magnetic fields that can be produced by excitation coils are small, a small change in magnetic field resulting from the presence of fine metal fragments is also small. This makes it impossible for detection coils to detect the change in magnetic field.

The detection coils also have a problem of size that increases with increasing number of turns of winding required to improve their detection sensitivity. Excitation coils also have the problem of increased size required to increase the number of turns of winding to enhance the level of alternating magnetic field. These factors contribute to an increase in the overall size of sensors.

This increase in the size of detection coils triggers the following problem. For detection of fine metal fragments, it is better suited for a detection coil to have a small detection spot. With a large spot of a detection coil, a change in magnetic field caused by fine metal fragments would be drowned in noise. On the other hand, reducing a detection spot would require a reduction in the size of the detection coil, such that the level of alternating magnetic field generated by the excitation coil would not be sufficiently large to take measurement.

JP-A-2004-85439 describes a conventional technique for detecting millimeter-scale metal contaminants. This technique uses a permanent magnet disposed at the center of a detection coil to detect millimeter-scale metal contaminants. Also disclosed is an opposite configuration used in this technique, that is, a detection coil is disposed at the center of a permanent magnet.

In this technique, disposing the permanent magnet at the center of the detection coil or disposing the detection coil at the center of the permanent magnet causes a problem of an increased transverse dimension of the sensor as a whole. Further, disposing the permanent magnet at the center of the detection coil causes a problem of increased size of the detection spot of the detection coil. On the other hand, disposing the detection coil at the center of the permanent magnet causes a problem of weak magnetic field generated by the permanent magnet.

JP-A-2005-83889 discloses a technique for overcoming the limitations of electromagnetic induction detection methods. To detect smaller contaminants, this technique utilizes the phenomenon of generating Joule heat as eddy current is induced in metal contaminants. This technique uses an infrared camera to detect infrared rays emitted from the metal contaminants.

CITATION LIST

Patent Literature

Patent Literature 1: JP-A-2004-85439
Patent Literature 2: JP-A-2005-83889

SUMMARY OF INVENTION

Technical Problem

An object of the present invention is to provide a small-sized metal detection sensor capable of detecting fine metal contaminants, using an electromagnetic induction detection technique.

Solution to Problem

According to a first mode of the present invention, to overcome the above-described problem, a metal detection sensor for detecting metal contained in an object under inspection moving through a passageway comprises: at least one magnet generating static magnetic field; and at least one magnetic-field sensor for detecting magnetic field generated by the metal, wherein: the magnet is located outside of the magnetic-field sensor along an axial direction perpendicular to a magnetic-field detection surface of the magnetic-field sensor; the magnetic-field sensor is located outside of the magnet along an axial direction connecting an N pole and an S pole of the magnet; and the magnet and the magnetic-field sensor are opposed to each other. The magnet and the magnetic-field sensor may be in contact and opposed or separated and opposed.

In the case that the magnetic-field sensor is a magnetoresistive device, a Hall device, a magnetic impedance device (amorphous wire magnetic-field sensor), the axial direction perpendicular to the magnetic-field detection surface of the magnetic-field sensor is the direction of a magnetic field to be detected (a magnetic field applied to the magnetic-field sensor). In the case that the magnetic-field sensor is a coil, the axial direction perpendicular to the magnetic-field detection surface of the magnetic-field sensor is the axial direction of the coil.

This configuration uses the magnet to increase the level of magnetic field. This leads to an increased detection sensitivity. In the case that the magnetic-field sensor is a coil, since the magnet is opposed to the magnetic-field sensor, radial space required to place the coil is smaller than that that would be required if the magnet and coil were arranged concentrically, making it possible to reduce the size of the coil. These advantages, in turn, make it possible to provide a small-sized metal detection sensor with improved detection sensitivity.

The magnet may be placed on a central axis of the magnetic-field sensor. This does not require that the central axis of the magnet necessarily coincide with the central axis of the magnetic-field sensor. Slight deviation of the axes from each other is permissible.

According to a second mode of the present invention, the magnetic-field sensor of the metal detection sensor may be a solenoid coil. Here, the solenoid coil refers to a coil formed by spirally winding a wire a plurality of turns along an axial direction of the coil. Increasing the number of turns of winding increases inductance and hence detection sensitivity to magnetic field. This allows even a small-sized coil to detect finer contaminants.

According to a third mode of the present invention, the magnetic-field sensor is a spiral coil. The axial direction perpendicular to the magnetic-field detection surface of the magnetic-field sensor coincides with the axial direction of the coil. The spiral coil has a wire spirally wound in a plane perpendicular to the axial direction of the coil.

According to a fourth mode of the present invention, the magnetic-field sensor is an pot-shaped coil. The axial direction perpendicular to the magnetic-field detection surface of the magnetic-field sensor coincides with the axial direction of the coil.

According to a fifth mode of the present invention, the coil of the metal detection sensor may have an air core, but preferably contains an iron core. The material for the iron core is soft iron, silicon steel plate, ferrite, permalloy, amorphous, or the like. The iron core may also be a magnet. The use of the iron core increases inductance and hence coil sensitivity. This makes it possible to detect finer contaminants.

According to a sixth mode of the present invention, there are a plurality of the above-described magnets that are opposed across the passageway. The N-to-S pole orientations of the plurality of magnets may coincide with each other. The arrangement of the plurality of magnets opposed across the passageway increases the level of magnetic field in the passageway, compared with the case of a single magnet.

According to a seventh mode of the present invention, the plurality of magnets are preferably disposed on opposite sides of the magnetic-field sensor along the axial direction of the magnetic-field sensor. The interposition of the magnetic-field sensor between the plurality of magnets increases a detection sensitivity to metal passing through the passageway.

According to an eighth mode of the present invention, there are a plurality of the above-described magnetic-field sensors that may be opposed across the passageway or disposed on the central axis of the magnetic-field sensors. The use of the plurality of magnetic-field sensors, when connected in series, increases the output of the magnetic-field sensors and thus detection sensitivity.

According to a ninth mode of the present invention, the plurality of magnetic-field sensors of the eighth mode may be disposed on opposite sides of the magnet along the axial direction connecting the N pole and the S pole of the magnet.

According to a tenth mode of the present invention, the magnetic-field sensor, located outside of the magnet along the axial direction connecting the N pole and the S pole of the magnet and opposed to the magnet, and the magnet, located outside of the magnetic-field sensor along the axial direction of the magnetic-field sensor and opposed to the magnetic-field sensor, form a pair. There are a plurality of such pairs that are disposed in parallel to or staggered from each other in the width direction of the passageway.

According to an eleventh mode of the present invention, the outputs of the plurality of magnetic-field sensors of the metal detection sensor are individually processed or connected in series.

According to a twelfth mode of the present invention, it is possible to detect both a metal contained in an object under inspection that generates a forward magnetic field and a metal contained in an object under inspection that generates a reverse magnetic field. The magnetic-field sensor outputs a signal that varies in polarity or amplitude, depending on whether the metal detected by the magnetic-field sensor is a metal generating a forward magnetic field or a metal generating a reverse magnetic field. This is due to the fact that the polarity or amplitude of magnetic field generated by metal varies depending on whether the metal generates a forward magnetic field or a reverse magnetic field.

The forward magnetic field and the reverse magnetic field are defined as follows. Metals contained in objects under inspection include aluminum, iron, copper, austenitic stainless steel, etc. Aluminum is a paramagnetic substance that is magnetized in the direction of magnetic field being applied. Iron is a ferromagnetic substance that is strongly magnetized especially in the direction of magnetic field being applied. Copper is a diamagnetic substance magnetized in the opposite direction to that of magnetic field being applied. Austenitic stainless steel is an antiferromagnetic substance that is strongly magnetized particularly in the opposite direction to that of magnetic field being applied. The magnetic field induced by the metal moving through the magnetic field being applied has a polarity that is determined by the property of the metal as a magnetic substance. In this application, the magnetic field generated by aluminum, iron, or the like pointing in the same direction as the magnetic field being applied is referred to as "forward magnetic field," and the magnetic field generated by copper, austenitic stainless steel, or the like pointing in the opposite direction to that of the magnetic field being applied is referred to as "reverse magnetic field."

Here, the level of a signal refers to its amplitude if it is an alternating current signal. For example, the level of a signal represented by $A(t)\sin(\omega t+\alpha)$ refers to the amplitude $A(t)$.

According to a thirteenth mode of the present invention, the shape of the magnet of the metal detection sensor is a solid cylinder, a hollow tube, a polygonal column, a truncated pyramid, a parabolic cylinder, or a truncated cone.

According to a fourteenth mode of the present invention, detection accuracy is improved by adding at least one magnetic-field detection sensor and at least one magnet in a passageway where the object under inspection is not present. The magnetic-field sensor(s) disposed in the passageway without the object under inspection preferably output a reference output indicative of the absence of the object under inspection.

According to a fifteenth mode of the present invention, a metal detection method for detecting metal contained in an object under inspection moving through a passageway, using a metal detection sensor, may comprise: measuring a reference output of the magnetic-field sensor when the object under inspection does not contain metal; measuring a detection output of the magnetic-field sensor when there is a possibility of presence of metal in the object under inspection; and calculating an output difference between the reference output and the detection output and determining that metal is contained in the object under inspection if the output difference is a predetermined value or greater.

According to a sixteenth mode of the present invention, in the case of using at least one magnetic-field sensor and at least one magnet disposed in a region where the above-described object under inspection is present, the metal detection method may comprise: measuring the reference output; measuring a detection output of the magnetic-field sensor disposed in a position where the object under inspection is present; and calculating an output difference between the reference output and the detection output and determining that metal is contained in the object under inspection if the output difference is a predetermined value or greater.

According to a seventeenth mode of the present invention, a metal detection sensor for detecting metal contained in an object under inspection moving through a passageway may be so configured that: the sensor comprises a magnet and a detection coil that are disposed around an outer circumference of the passageway to surround the passageway; and the magnet generates magnetic field; and the detection coil detects magnetic field as the metal passes through the magnetic field generated by the magnet.

According to an eighteenth mode of the present invention, the magnet according to the seventeenth mode may have an excitation coil and a magnetic body.

According to a nineteenth mode of the present invention, the metal detection sensor is capable of detecting a speed of the metal.

According to a twentieth mode of the present invention, the metal detection sensor for detecting metal contained in an object under inspection moving through a passageway comprises: first and second magnets generating static magnetic field; and a first magnetic-field sensor for detecting magnetic field generated by the metal, wherein: the first and second magnets are opposed on opposite sides of the passageway; the first magnet is disposed outside of the second magnet along an axial direction connecting an N pole and an S pole of the second magnet; and the second magnet is disposed outside of the first magnet along an axial direction connecting an N pole and an S pole of the first magnet; the first magnetic-field sensor and the second magnet are opposed on opposite sides of the passageway; the first magnetic-field sensor is disposed outside of the second magnet along the axial direction connecting the N pole and the S pole of the second magnet; and the second magnet is disposed outside of the first magnetic-field sensor along an axial direction perpendicular to a magnetic-field detection surface of the first magnetic-field sensor; and the metal detection sensor comprises a magnetic member connecting poles of the first and second magnets located on opposite sides of the first and second magnets to the passageway.

According to a twenty-first mode of the present invention, the first magnetic-field sensor of the metal detection sensor is a coil wound around an iron core or a magnet.

According to a twenty-second mode of the present invention, a metal detection sensor comprises a second magnetic-field sensor, wherein the second magnetic-field sensor and the first magnet are opposed on opposite sides of the passageway; the second magnetic-field sensor is disposed outside of the first magnet along the axial direction connecting the N pole and the S pole of the first magnet; and the first magnet is disposed outside of the second magnetic-field sensor along an axial direction perpendicular to a magnetic-field detection surface of the second magnetic-field sensor.

According to a twenty-third mode of the present invention, the first magnetic-field sensor of the metal detection sensor is a coil that is disposed on an outer circumference of the first magnet; and the second magnetic-field sensor is a coil that is disposed on an outer circumference of the second magnet.

According to a twenty-fourth mode of the present invention, in the metal detection sensor, the first magnet, disposed outside of the second magnet along the axial direction connecting the N pole and the S pole of the second magnet, the second magnet, disposed outside of the first magnet along the axial direction connecting the N pole and the S pole of the first magnet, and the magnetic-field sensor, disposed outside of the second magnet along the axial direction connecting the N pole and the S pole of the second magnet, form a set; there are a plurality of such sets; and the plurality of sets are disposed in parallel to or staggered from each other in a width direction of the passageway; and orientations of magnetic fields generated by any adjacent sets are antiparallel to each other.

According to a twenty-fifth mode of the present invention, the metal detection sensor comprises at least either a first magnetic member interconnecting poles of any adjacent first magnets located on opposite sides of the adjacent first magnets to the passageway or a second magnetic member interconnecting poles of any adjacent second magnets located on opposite sides of the adjacent second magnets to the passageway.

According to a twenty-sixth mode of the present invention, a metal detection sensor for detecting metal contained in an object under inspection moving through a passageway comprises: a plurality of first magnets generating static magnetic field disposed on one side of the passageway; and a first magnetic-field sensor for detecting magnetic field generated by the metal, wherein: the plurality of first magnets are arranged in one row so that axes connecting N poles and S poles of the magnets align in the same direction; and any two adjacent first magnets are so arranged that the polarity of a pole of one of the two magnets disposed on a side of the other magnet is the same as the polarity of a pole of the other magnet disposed on a side of said one of the two magnets.

According to a twenty-seventh mode of the present invention, the metal detection sensor, whose first magnetic-field sensor is disposed on said one side of the passageway, comprises: a plurality of second magnets for generating static magnetic field disposed on another side of the passageway; and a second magnetic-field sensor for detecting magnetic field generated by the metal, the second magnetic-field sensor being disposed on said another side of the passageway, wherein: the plurality of second magnets are arranged in one row so that axes connecting N poles and an S poles of the magnets align in the same direction; and any adjacent two second magnets are so arranged that the polarity of a pole of one of the adjacent second magnets, which pole is disposed on a side of the other second magnet, is the same as the polarity of a pole of the other second magnet, which pole is disposed on a side of said one of the adjacent second magnets.

According to a twenty-eighth mode of the present invention, the metal detection sensor is so configured that the intensity of magnetic field generated by the magnet is set by a distance between the N pole and the S pole of the first magnet.

BRIEF DESCRIPTION OF DRAWINGS

FIG. 4 is a side view of some possible arrangements of some possible numbers of magnets and coils.

FIG. 8 is graphs of outputs for a metal generating a reverse magnetic field and a metal generating a forward magnetic field.

FIG. 21 is a plan view of a contaminant detection system according to another embodiment of the present invention.

FIG. 22(a) shows a solenoid winding, and FIGS. 22(b) and (c) show a spiral winding.

DESCRIPTION OF EMBODIMENTS

Figure 1:
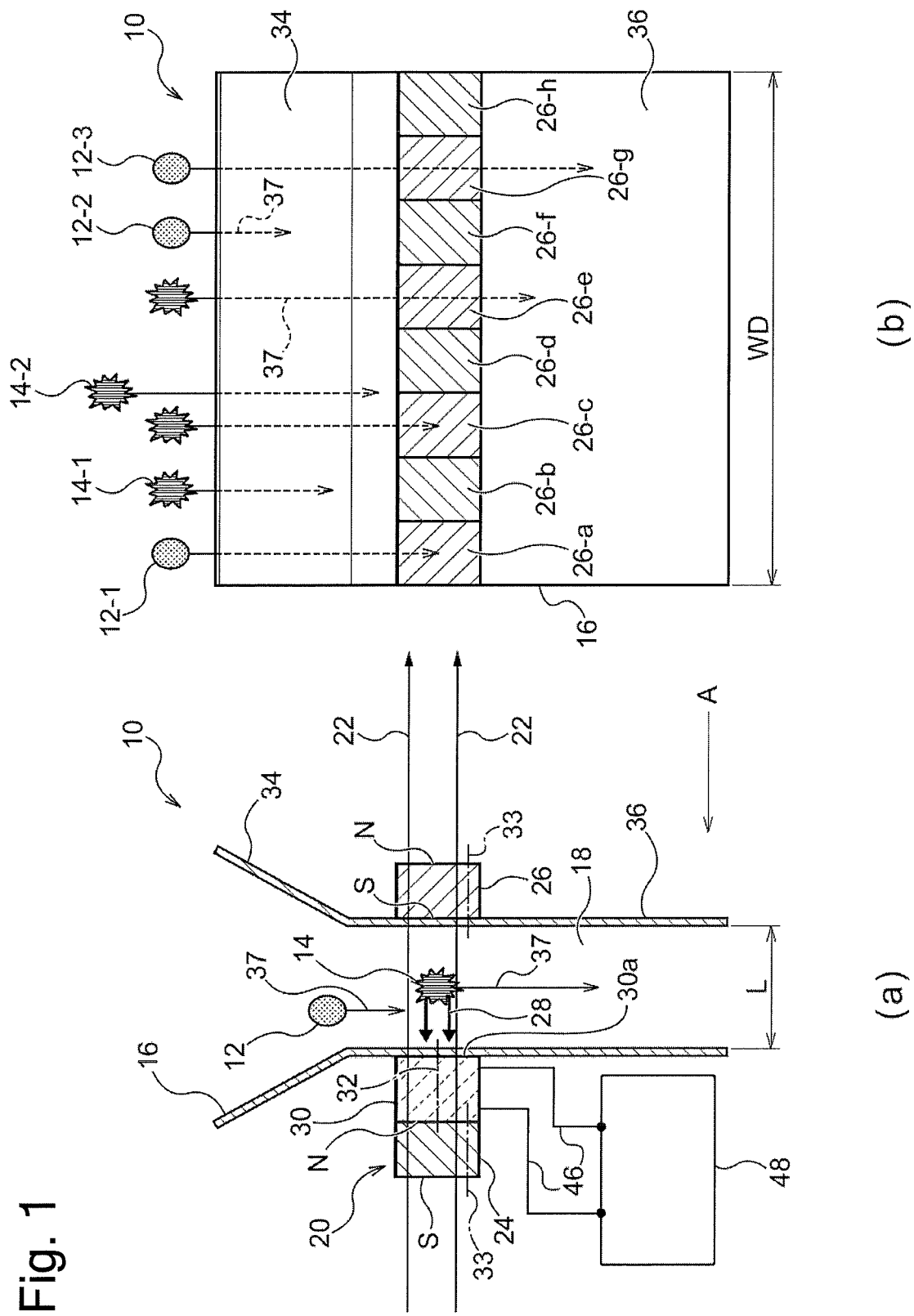
FIG. 1 shows a schematic structure of a contaminant detection system using a metal detection sensor according to the first embodiment of the present invention.

Now, an example of a contaminant detection system using a metal detection sensor according to one embodiment of the present invention will be described in detail with reference to the accompanying drawings. Below, like members are denoted by like reference numerals.

FIG. 1 shows a schematic structure of a contaminant detection system 10 using a metal detection sensor according to one embodiment of the present invention. This embodiment concerns an example of a use in inspection of finished products of foodstuffs or pharmaceuticals. The finished products described in this embodiment are in a powder or granular form of the order of 1 mm in size. Here, a powder product contaminated with metal will be described by way of example. This product is electrically nonconductive. The present invention is applicable to other forms of products than powder and granular forms. For example, the present invention is applicable to tablet and liquid products. Also, the present invention have applications other than contaminant inspection. For example, the present invention can be used to determine a change in metal film thickness or the presence of metal.

FIG. 1(a) is a side view, and FIG. 1(b) is a front view as viewed in direction A of FIG. 1(a). The contaminant detection system 10 detects metal 14 (i.e., contaminants) contained in an object under inspection. This object under inspection contains a powder product 12, such as pharmaceutical or food, and a metal 14 mixed in the product 12. The product 12 is made of a nonmetal organic or inorganic substance or the like that is electrically nonconductive.

The system 10 comprises: a feed machine 16, though which the product 12 and the metal 14 flow; and a metal detection sensor 20 for detecting metal 14 mixed in the product 12 moving through a passageway 18 of the feed machine 16. The sensor 20 comprises: a plurality of magnets 24, 26 generating static magnetic field (magnetic field lines) 22; and a plurality of coils 30 (magnetic-field sensors) for detecting magnetic field 28 generated by the metal 14 as a result of motion of the metal 14 in the magnetic field 22.

In this embodiment, the two magnets 24, 26, exhibiting a high magnetic flux density, are disposed in opposed relation to detect the metal 14. More specifically, the magnets 24, 26 are outside of the coil 30 along a central axis 32 (an axis perpendicular to a magnetic-field detection surface of the magnetic-field sensor) of the coil 30. The coil 30 is located outside of the magnets 24, 26 along the direction of an axis 33 connecting the N pole and S pole of the magnets 24, 26 in such a manner that the magnets 24, 26 and the coil 30 are opposed to each other. Here, the magnetic-field detection surface of the coil refers to a surface 30a of an end of the coil on the passageway 18.

Between the two magnets 24, 26 is disposed the solenoid coil 30 of large inductance. In other words, the plurality of magnets 24, 26 are disposed on opposite sides of the coil 30 along the direction of the central axis 32 of the coil 30. As the metal 14 passes between the two magnets 24, 26, an electromotive force is induced in the coil 30. In the absence of the metal 12 passing therethrough, no electromotive force is induced in the coil 30. The metal 14 is detected by calculating the difference between the electromotive force induced by the metal 14 and a voltage through the coil 30 measured in advance in the absence of the metal 14.

The product 12 is, for example, electrically nonconductive pharmaceutical powder. In FIG. 1, the metal 14, a contaminant, is aluminum, iron, copper, austenitic stainless steel, or the like. Aluminum is a paramagnetic substance magnetized in the direction of magnetic field 22 being applied. Iron is a ferromagnetic substance strongly magnetized especially in the direction of the magnetic field 22. Copper is a diamagnetic substance magnetized in the direction opposite to the magnetic field 22, and austenitic stainless steel is an antiferromagnetic substance strongly magnetized especially in the direction opposite to the magnetic field 22. For this reason, magnetic field 28 generated by the metal 14 moving in the magnetic field 22 has a polarity that is determined by the property of the metal 14 as a magnetic material. Magnetic fields generated by aluminum, iron, etc., pointing in the same direction as the magnetic field 22 being applied will be referred to as "forward magnetic fields," and magnetic fields generated by copper, austenitic stainless steel, etc., pointing in the direction opposite to the magnetic field being applied will be referred to as "reverse magnetic fields." The magnetic field 28 shown in FIG. 1 is an example of reverse magnetic field generated by the metal 14 that generates reverse magnetic field.

The feed machine 16 comprises: an inlet 34, which is V-shaped as viewed from the side shown in FIG. 1(*a*); and a detector 36 located downstream of the inlet 34 and provided with the metal detection sensor 20. This metal detection sensor 20 is disposed on an outer wall of the detector 36. The inlet 34 and the detector 36 are arranged as two opposed flat plates. The passageway 18 has a cross section 18*a* that is rectangular in shape as viewed from the top of FIG. 1, as shown in FIGS. 18 to 21, which will be described later. Although in this embodiment, the cross section 18*a* of the passageway 18 is rectangular, the present invention is not limited to this shape of passageway; instead, the shape may be circular, polygonal, or of any other cross sectional shape.

In the embodiment of FIG. 1, the metal detection sensor 20 is disposed outside of the passageway 18. The present invention is not limited to this arrangement; instead, the metal detection sensor 20 may be disposed within the passageway 18. Alternatively, part of the metal detection sensor 20 may be disposed within the passageway 18 so that the remainder of the metal detection sensor 20 is located outside the passageway 18.

The product 12 is fed from the top of the feed machine 16, free-falls under the action of gravity in the direction of arrow 37, and is inspected by the detector 36 for any metal 14. The inlet 34 and the detector 36 is made of an electrically nonconductive material such as plastic. The depth L of the passageway is, for example, 1 cm.

Figure 2:
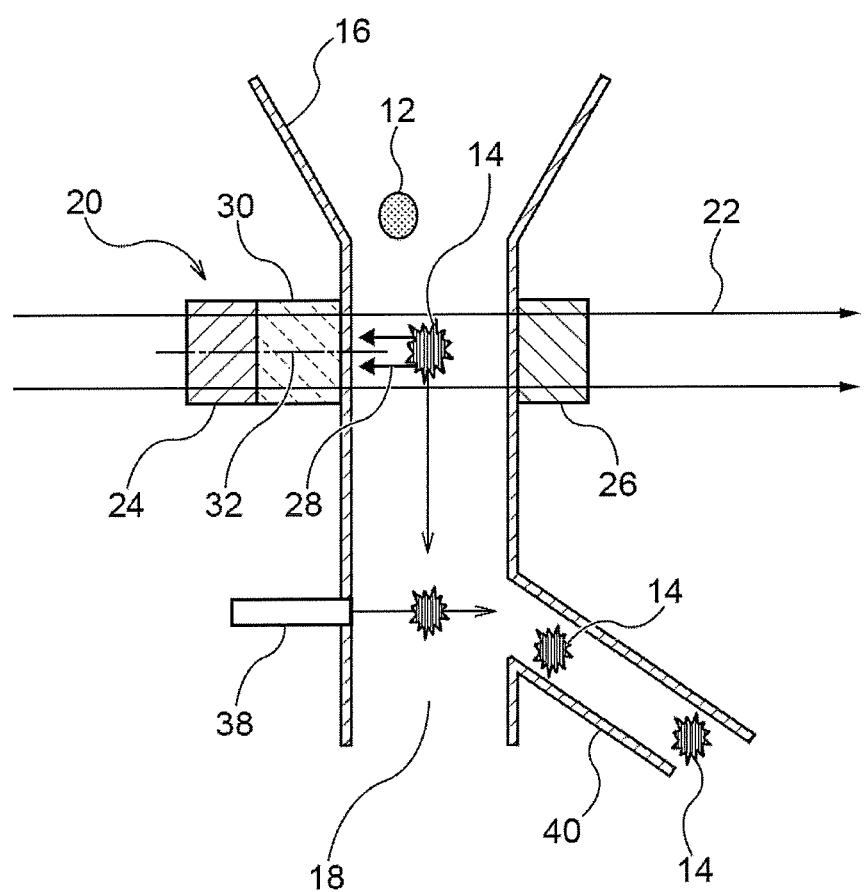
FIG. 2 is a side view of a mechanism for removing metal.

Downstream of the detector 36 are disposed an air gun 38 and a branch 40, as shown in FIG. 2. FIG. 2 is a side view of a mechanism for removing metal. When the metal detection sensor 20 detects metal 14, a signal indicative of the detection is transmitted via a detection circuit 48, connected to the metal detection sensor 20, to a controller (not shown) controlling the air gun. The controller controls the air gun 38 to blow air, sending the metal 14 into the branch 40. Meanwhile, the product 12 flows directly downward through the passageway 18.

Figure 3:
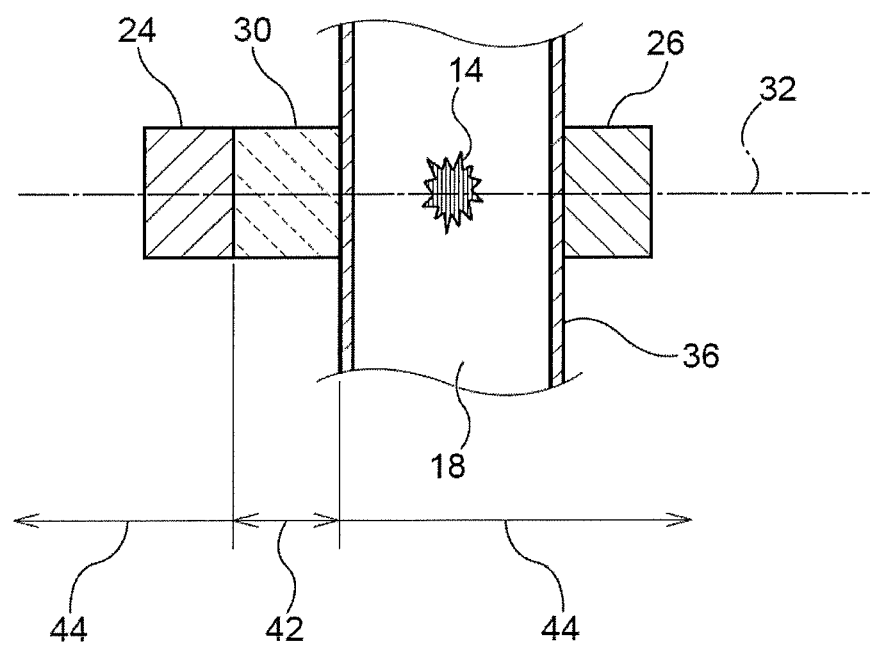
FIG. 3 is a partial side view of only the metal detection sensor 20 of FIG. 1(a).

The magnets 24, 26 of the metal detection sensor 20 are opposed to the coil 30. In this embodiment, the magnets 24, 26 are disposed on the central axis 32 of the coil 30 and are located outside of the coil 30. The language "disposed on the central axis 32 of the coil 30 and is located outside of the coil 30" means that the magnets 24, 26 lie on the central axis 32 of the coil 30 and are present in a region 44 that excludes a region 42 where the coil 30 is present, as shown in FIG. 3. FIG. 3 is a partial side view of only where the metal detection sensor 20 of FIG. 1(*a*) is present.

Figure 18:
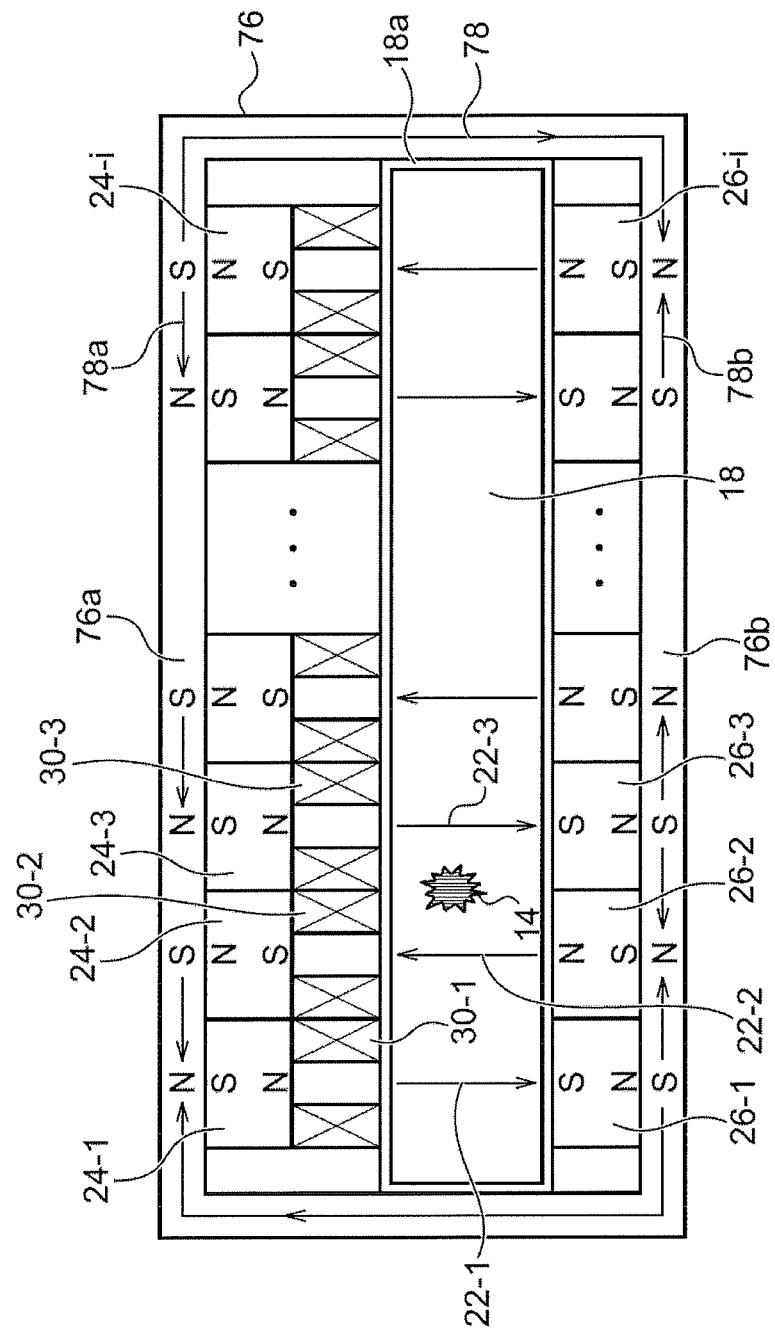
FIG. 18 is a plan view of a contaminant detection system according to still another embodiment of the present invention.
Figure 19:
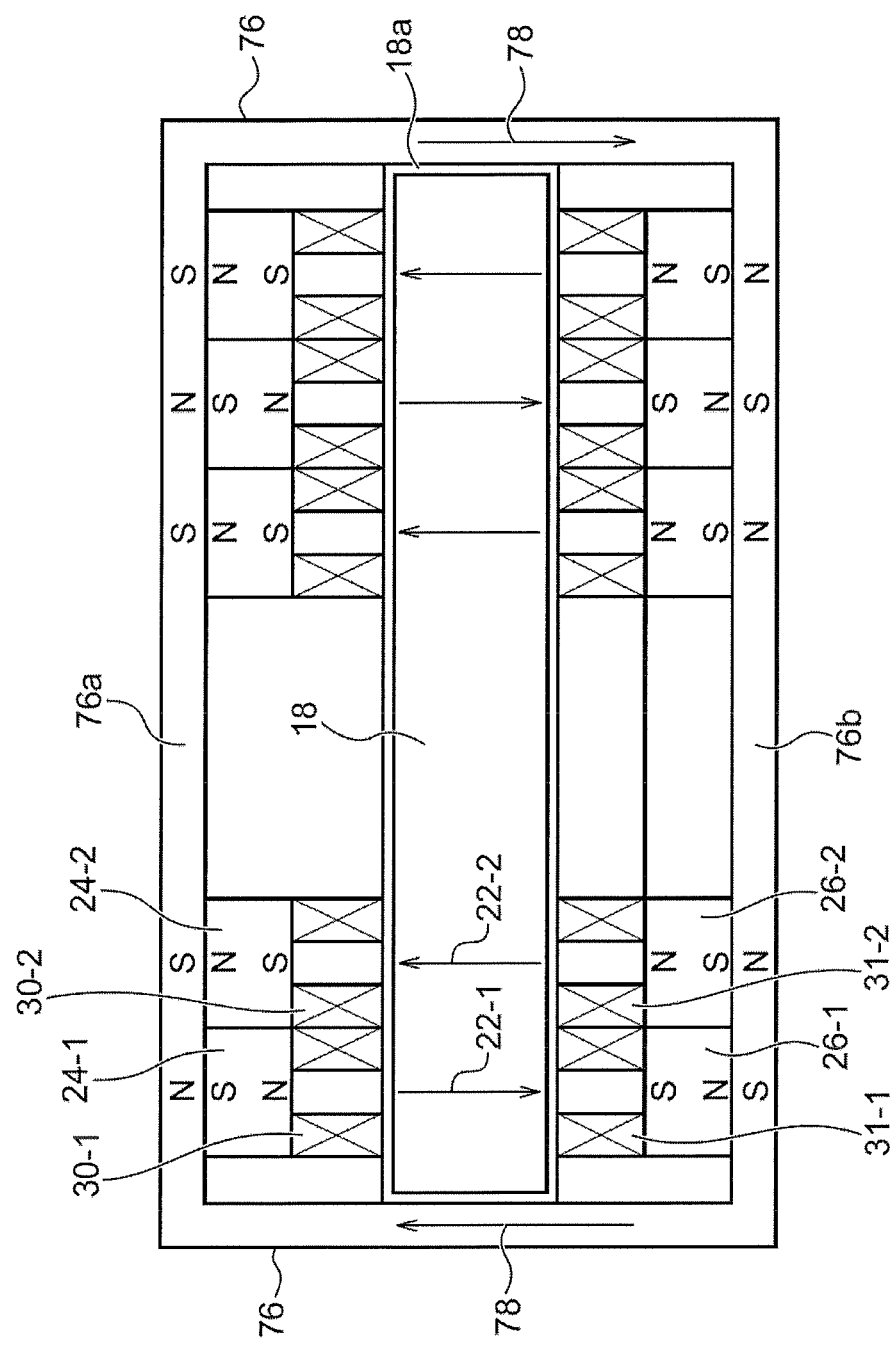
FIG. 19 is a plan view of a contaminant detection system according to still another embodiment of the present invention.
Figure 20:
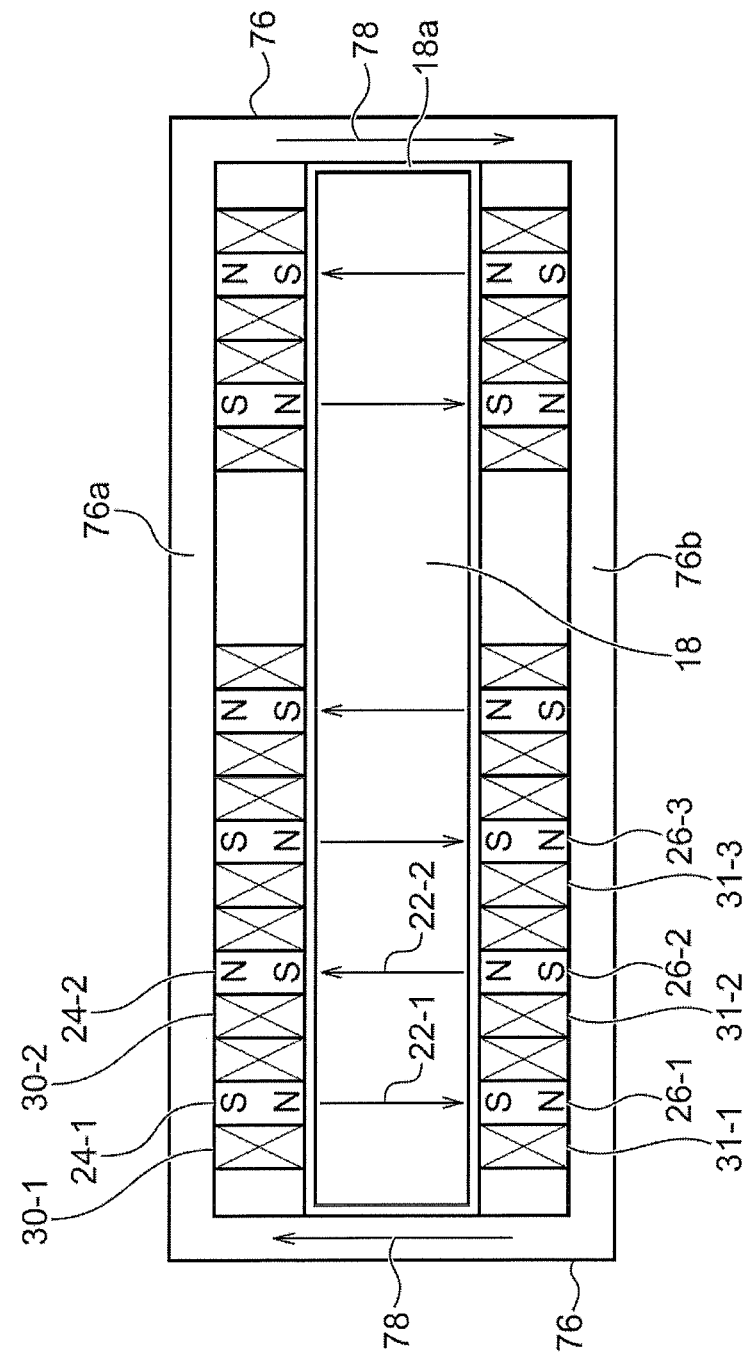
FIG. 20 is a plan view of a contaminant detection system according to still another embodiment of the present invention.

The embodiment of FIG. 1 uses the two magnets 24, 26 of the same shape/size exhibiting the same magnetic flux density. Alternatively, the magnets 24, 26 may differ in some or all of the categories: shape, size, and magnetic flux density. The plurality of magnets 24, 26 are opposed across the passageway 18, the N-to-S pole orientations of the plurality of magnets 24, 26 are the same. However, the N-to-S pole orientations of the plurality of magnets 24, 26 do not have to be the same, as illustrated in FIGS. 18 to 20 (described later). In FIGS. 18 to 20, a plurality of magnets 24, 26 are so arranged that the N-to-S pole orientations of adjacent magnets 24, 26 are opposite to each other. In FIG. 1(*a*), the surface indicated by "N" is the N pole of the magnets 24, 26, and the surface "S" is the S pole of the magnets 24, 26.

In FIG. 1, the magnetic field 22 is generated in a direction that crosses as right angles to the direction of descend (direction of motion) 37 of the metal contaminant 14, and the magnetic-field detection surface 30*a* of the coil 30 is perpendicular to the magnetic field 22. In other words, the direction of descent (direction of motion) 37 is perpendicular to the axial direction of the coil and the direction of the magnetic field 22. This permits the coil 30 to efficiently detect a change in the magnetic field 22 caused by the metal 14. In FIG. 1, the direction of movement of the metal contaminant 14 is downward in the direction of gravity. However, the present invention does not limit the direction of movement to the direction of gravity; instead, the direction of movement may be opposite to that of gravity. Alternatively, the direction of movement may be horizontal, obliquely upward or obliquely downward to the horizontal.

The plurality of magnets 24, 26 are disposed on opposite sides of the coil 30. More specifically, the coil 26 and the magnet 26 are bonded or welded to or screwed into the outer wall of the detector 36, and similarly, the magnet 24 is bonded or welded to or screwed into the coil 30.

In the case where metal fragments to be detected vary in dimensions or material, for example because products are produced under different manufacturing conditions or on different days, the magnets 24 and 25 may vary in N, S magnetic pole areas, distance between the magnets 24 and 26, or shape. This changes the surface magnetic flux density of the magnets 24, 26. The magnets 24, 26 may be of other shape: the shape of a solid cylinder, a hollow tube (i.e., cylinder), a rectangular column, a truncated pyramid, a parabolic cylinder, or a truncated cone.

The locations and the number of magnets and coils are not limited to those shown in FIG. 1(*a*). Other examples will be described with reference to FIGS. 4(*a*) to (*f*). FIGS. 4(*a*) to (*f*) are side views of some possible locations and numbers of magnets and coils, showing only the location of the metal detection sensor 20 of FIG. 1. In FIGS. 4(*a*) to (*c*), the metal detection sensor 20 includes one coil 30 and one magnet 26. In FIG. 4(*a*), the coil 30 and the magnet 26 are opposed via the passageway 18. In FIGS. 4(*b*) and (*c*), the coil 30 and the magnet 24 are disposed only on one side of the passageway 18. In FIG. 4(*b*), the coil 30 is disposed on the passageway 18 side of the magnet 18. Conversely, in FIG. 4(*c*), the magnet 24 is disposed on the passageway 18 side of the coil 30.

In FIGS. 4(*d*) to (*f*), the metal detection sensor 20 includes one coil 30 and two magnets 26. The use of two magnets increases magnetic flux density and thus detection sensitivity, compared with one magnet. In FIG. 4(*d*), the magnets 24, 26 are opposed via the passageway 18. The magnet 24 is disposed on the passageway 18 side of the coil 30. In FIGS. 4(*e*) and (*f*), the magnets 24, 26 are disposed only on one side of the passageway 18. In FIG. 4(*e*), the coil 30 is disposed on the same side of the passageway as magnets 24-1, 24-2, and the coil 30 is disposed on the passageway 18 side of the magnets 24-1, 24-2. In FIG. 4(*f*), the coil 30 is disposed on the opposite side of the passageway to the magnets 24-1, 24-2.

Figure 5:
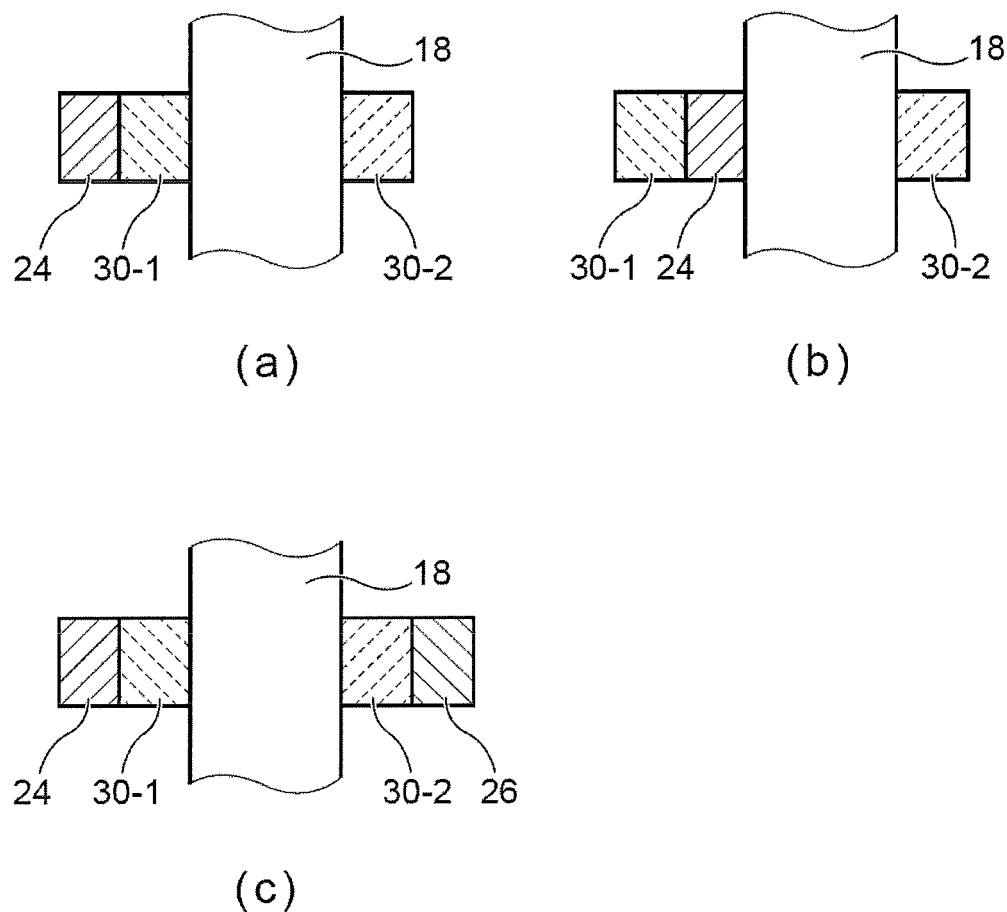
FIG. 5 is a side view of some possible arrangements of some possible numbers of magnets and coils.

FIG. 4 shows examples of configuration with one coil 30, but there may instead be a plurality of coils 30. An example of such configuration is shown in FIG. 5. In FIGS. 5(*a*) and (*b*), coils 30-1, 30-2 are opposed via the passageway 18. There is only one magnet 24. The plurality of coils 30-1, 30-2 are disposed on opposite sides of the magnet 24 along the direction of an axis 33 connecting the N- and S-pole of the magnet 24. In FIG. 5(*a*), the coil 30-1 is disposed on the passageway 18 side of the magnet 24. In FIG. 5(*b*), the magnet 24 is disposed on the passageway 18 side of the coil 30-1. In the case of a plurality of coils 30, their outputs are connected in series to increase their overall output and hence detection sensitivity.

In FIG. 5(*c*), the coils 30-1, 30-2 are opposed via the passageway 18. In FIG. 5(*c*), the coil 30-1, 30-2 are disposed on the passageway 18 side of the magnets 24, 26. The magnets 24, 26 may instead be disposed on the passageway 18 side of the coils 30-1, 30-2.

In the embodiments of FIGS. 4 and 5, the coils 30, 31-1, 30-2 and the magnets 24, 26 lie on the coil central axis 32. In the embodiments of FIGS. 1 to 5, detection sensitivity increases with increasing inductance of the coils 30, 30-1, 30-2 or increasing magnetic flux density of the magnets 24, 26, and such increased detection sensitivity makes it possible to detect fine metal fragments. The magnets 24, 26 may be permanent magnets or electromagnets so long as they produce static magnetic field. Such an electromagnet is a magnet with a core (iron core) of magnetic material having a coil wound around it so as to produce magnetic force temporarily, i.e., when the magnetic is energized. In this embodiment, direct current is applied to the coil to generate static magnetic field.

Referring back to FIG. 1(*b*), the two coils 24, 26 are paired up with the single coil 30. In other words, the coil 30, located outside of the magnets 24, 26 along the direction of the axis 33 connecting the N pole and the S pole of the magnets 24, 26 and opposed to the magnets 24, 26, is paired up with the magnets 24, 26, disposed outside of the coil 30 along the central axis 32 of the coil 30 and opposed to the coil 30.

There a plurality of such pairs, which are disposed in parallel to each other in the direction of width WD of the passageway 18. In FIG. 1(*b*), there are eight pairs, the magnets 26-*a* to 26-*h* of which are shown in FIG. 1(*b*). The width WD extends over the entire range where metal 14 is to be detected. The width WD represents the detection range for metal 14. The magnetic fields 22 generated by the magnets 26-*a* to 26-*h* are the same in direction and point in the same direction. The directions of magnetic fields 22 generated by the magnets 26-*a* to 26-*h* do not have to be the same. For example, as shown in FIG. 18, etc., (described later), magnetic fields generated by any adjacent pairs may be antiparallel to each other.

Figure 6:
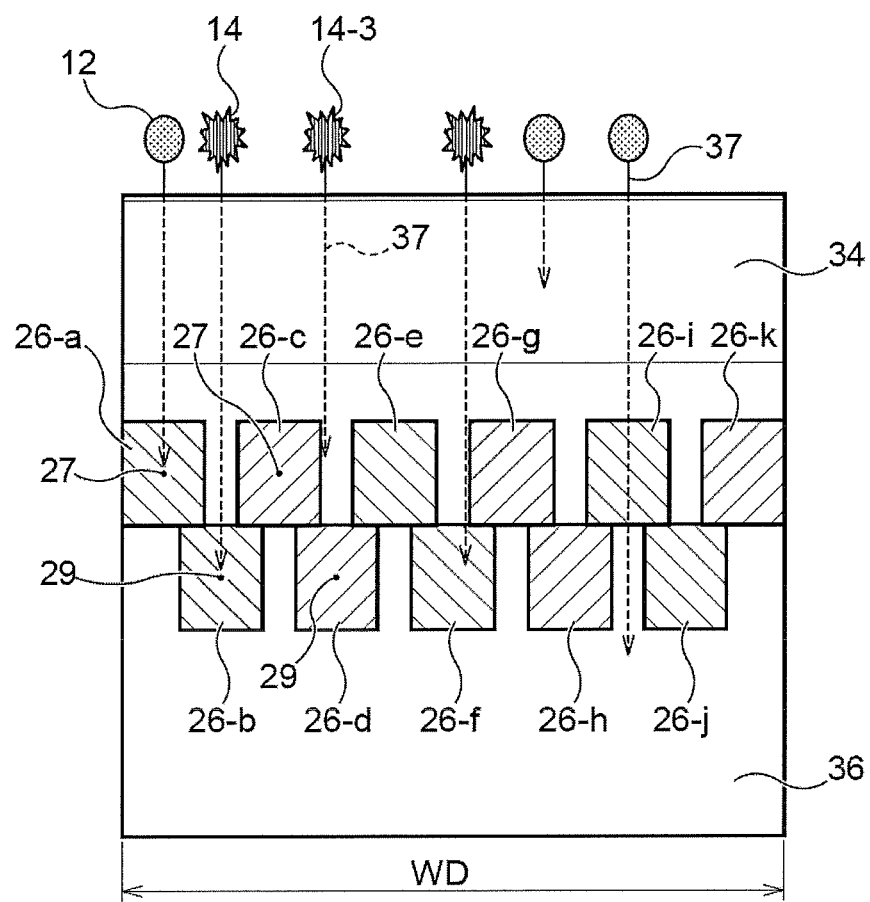
FIG. 6 is a front view of a plurality of pairs of magnets and coils 30 in a staggered configuration.

The plurality of pairs may be staggered relative to each other in the direction of width WD of the passageway 18. This arrangement is shown in FIG. 6. The magnets 26-*a* to 26-*k* are disposed in two rows so as not to superimpose on each other. The magnets in a first row are staggered from the magnets in a second row. FIG. 6 shows one example of such configuration. The magnet 26-*b* has a center 29, which is located between centers 27 of the magnets 26-*a* and 26-*c* along the left-right direction of FIG. 6. The center 27 of the magnet 26-*c* is located between the center 27 of the magnets 26-*b* and 26-*d* along the left-right direction of FIG. 6.

FIG. 6, relating to eleven pairs, shows their respective magnets 26-*a* to 26-*k*. As an advantageous effect over the configuration of FIG. 1(*b*), each of adjacent magnets in the staggered configuration is less affected by the other magnet. The magnet 26-*f*, for example, separated from the adjacent magnets 26-*e*, 26-*g*, are less affected by the magnetic fields from the magnets 26-*e*, 26-*g*.

The magnet configuration of FIG. 6 has another advantageous effect over that of FIG. 1. In the configuration of FIG. 1, the sensitivity of the coil 30 drops at the boundary between the magnets 26-*c* and 26-*d*. Metal 14-2 falling along the boundary between the magnets 26-*c* and 26-*d* may escape detection.

In the case of FIG. 6, suppose metal 14-3 falling along the boundary between the magnets 26-*c* and 26-3. Since this boundary lies near the center of the magnet 26-*d*, the sensitivity of the coil 30 at the magnet 26-*d* does not drop. As such, the metal 14-3 passes a region of high sensitivity. In other words, the staggered configuration of FIG. 6 has an advantage of being free of any region where coil sensitivity drops.

Metal 14 mixed in the product 12 is iron, austenitic stainless steel, copper or the like. Iron is a ferromagnetic substance strongly magnetized especially in the direction of the magnetic field 22 to generate a forward magnetic field pointing in the same direction as the magnetic field 22. Austenitic stainless steel is an antiferromagnetic substance strongly magnetized especially in the direction opposite to the magnetic field 22 to generate a reverse magnetic field. Copper is a diamagnetic substance that sets up a weak reverse magnetic field in the direction opposite to the magnetic field 22.

FIGS. 1 and 2 show a magnetic field 28 generated by an austenitic stainless steel, an antiferromagnetic substance strongly magnetized especially in the direction opposite to the magnetic field 22 to generate a reverse magnetic field. The system of this embodiment is capable of detecting metals such as iron, austenitic stainless steel, and copper. The coil 30 outputs a signal that varies in polarity or amplitude, depending on whether the metal 1 detected by the coil 30 is one that sets up a forward magnetic field or a reverse magnetic field. In the case of a metal that sets up a reverse magnetic field, the reverse field 28 occurs as shown in FIG. 1. With the metal 14 that sets up a forward magnetic field, the forward field 28 occurs as shown in FIG. 7.

Figure 7:
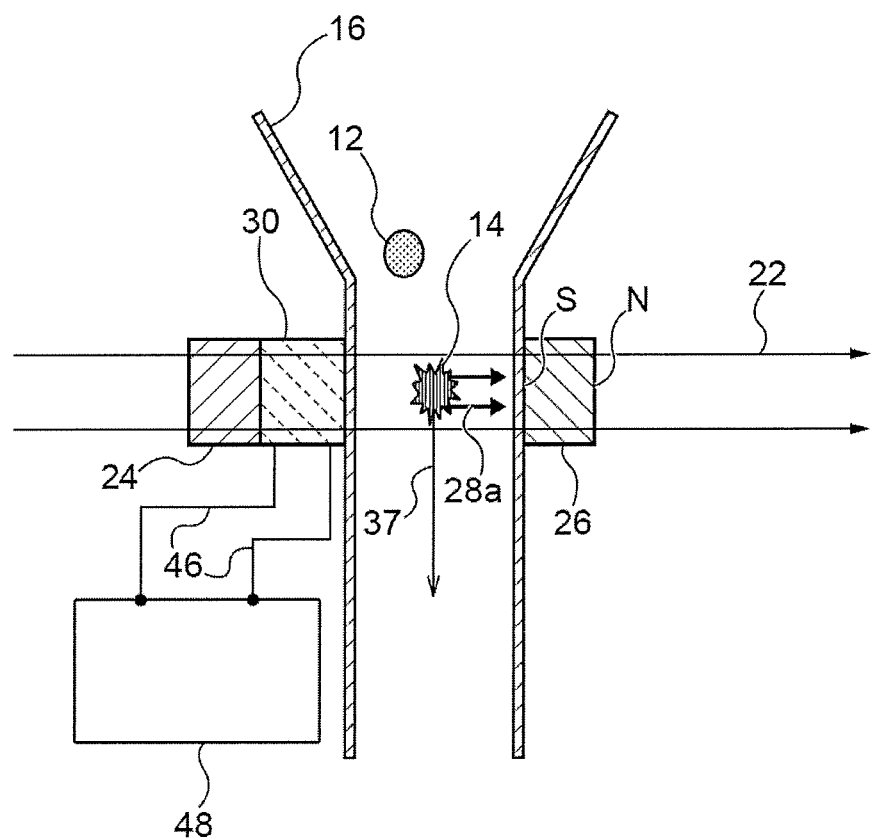
FIG. 7 is a side view of magnetic field 28a generated by a contaminant which is a metal generating a forward magnetic field, using the same device and the same product as those of FIG. 1.

FIG. 7 shows the magnetic field 28*a* generated from a metal contaminant that sets up a forward magnetic field, using the same device and the same product as those of FIG. 1. The magnetic field 28*a*, induced as the metal that sets up a forward magnetic field moves in the magnetic field 26, is in the same direction as the magnetic field 22 and in the opposite direction to the magnetic field 28 of FIG. 1.

A metal that sets up a forward magnetic field, e.g., iron, has a high magnetic permeability, and the magnetic field 22 concentrates at a location of high magnetic permeability. In the magnetic field 22, a magnetic flux (Φ)22 is attracted to the metal 14 itself that produces a forward magnetic field. In contrast, a metal that sets up a reverse magnetic field, e.g., copper, has a low permeability. As the metal 14 that sets up a reverse magnetic field passes through the magnetic field 22, the metal 14 produces the reverse magnetic field 28 pointing in the opposite direction to the magnetic field 22 and being proportional to the magnitude of a change in the magnetic flux density (B) (magnetic field 22). This results in the magnetic field 22 being reduced by the reverse magnetic field 28. The magnitude of the change is proportional to the intensity of the magnetic field 22 and the size and speed of the passing metal 14 that sets up the reverse magnetic field.

In other words, the metal 14 that sets up a reverse magnetic field generates a magnetic flux (Φ)28 in a direction in which it cancels a change in magnetic flux experienced by the metal 14; thus, a metal that sets up a forward magnetic field and a metal that sets up a reverse magnetic field have different signs of detection signal. This makes it possible to detect the detection signal from the coil 30 and determine from the polarity or amplitude of that signal whether the metal 14 is a metal that sets up a forward magnetic field or a metal that sets up a reverse magnetic field. Metals that generate a forward magnetic field are, for example, iron, cobalt, nickel, gadolinium, ferrite, aluminum, etc. The metal detection sensor described in the present application is capable of measuring the complex impedance of the coil 30. Such a complex impedance, having a real part and an imaginary part, can be thought of as a vector. The magnitude (real value) of the real part of the vector, the magnitude (real value) of the imaginary part, and/or the absolute value or argument of the vector can be used alone or in combination to determine the presence of metal or classify such a metal as a metal that sets up a forward magnetic field or a metal that sets up a reverse magnetic field. In this sense, the metal detection sensor of the present application can be used as a sensor for metal classification.

The output 46 of the coil 30 is transmitted to the detection circuit 48 shown in FIGS. 1(*a*) and 7. An example of the output 46 of the coil 30 is shown in FIG. 8. FIG. 8(*a*) is a graph of the output for the metal of FIG. 1(*a*) that sets up a reverse magnetic field. FIG. 8(*b*) is a graph of the output for the metal of FIG. 7 that sets up a forward magnetic field. In FIGS. 8 (*a*) and (*b*), the horizontal axis represents time t and the vertical axis represents induced electromotive force V. The induced electromotive force V corresponds to A(t) in A(t)Sin(ωt+α) described earlier. The output 46 of the coil 30 outputs a signal 50 in the absence of metal 14 and signal 52, 54 in the present of metal 14. Comparing the signal 52, 54 with the signal 50, the level of the signal 52 is higher than that of the signal 50, the level of the signal 54 lower than that of the signal 50. In other words, the signal 52 and the signal 54 are opposite in polarity.

The embodiment of FIG. 1 uses a plurality of coils 30. One of the outputs of the coils 30 is detected, or a plurality of them are combined and connected in series, so as to measure an electromotive force induced by the metal 14. Such combination is selected in any suitable manner by taking into account measurement conditions or the like. For example, all of the coils may be wire-connected in series. This produces maximum detection sensitivity to metal contaminants. Alternatively, the coils 30 may be divided in two or more groups, the coils 30 of each group being wire-connected in series. Whether to divide the coils into groups can be determined, for example, according to the level of signals 52, 54 or division of the air guns 38 into groups (i.e., the number of air guns 38).

Now, a metal detection technique for detecting metal 14 moving through the passageway 18, using the metal detection sensor 30 of FIG. 1 will be described.

First, a product 12 that has been determined to be free of metal 14 is fed into the feed machine 16 to measure the output (induced electromotive force) from the coils 30 wire-connected in series as described earlier, using the detection circuit 48. The detection circuit 48 stores this output as a reference output (Vnonmetal) in unillustrated internal memory. The reference output is a signal 50 shown in FIGS. 8 (*a*), (*b*). Next, a product 12 that may be contaminated with metal 14 is fed to the feed machine 16 for the detection circuit 48 to measure the resultant induced electromotive force. This induced electromotive force is a detection output (Vmetal), i.e., the signal 52, 54 shown in FIGS. 8 (*a*) and (*b*). The detection circuit 48 measures the difference in output Vdef (=Vmetal−Vnonmental) between the reference output 50 and the detection output 52, 54. In the case of the signal 54, the output difference Vdef is negative (minus); thus, its absolute value will be used for comparison with a threshold value described later.

When the output difference Vdef shown in FIGS. 8 (*a*) and (*b*) rises above a predetermined value 51 (preset threshold value), the detection circuit 48 determines that the product 18 contains metal. The detection circuit 48 transmits a signal indicative of detection to a controller (not shown) controlling an air gun. The controller controls the air gun 38 to blow air, so that the metal 14 is thrown away into the branch 40. In this way, the metal 14 is separated.

The predetermined value 51 (preset threshold value) is determined in advance through experimentation, using a plurality of samples each containing one metal contaminant of different size and a plurality of samples each containing a plurality of different metal contaminants of different and/or identical size.

Next, another embodiment of the present invention will be described with reference to FIG. 9. In this embodiment, the contaminant detection system has an additional pair of the coil and magnets of FIG. 1(*a*) disposed in a passageway W1 free of an object under inspection. The coil disposed in the passageway W1 free of an object under inspection outputs a reference output corresponding to the absence of an object under inspection.

Figure 9:
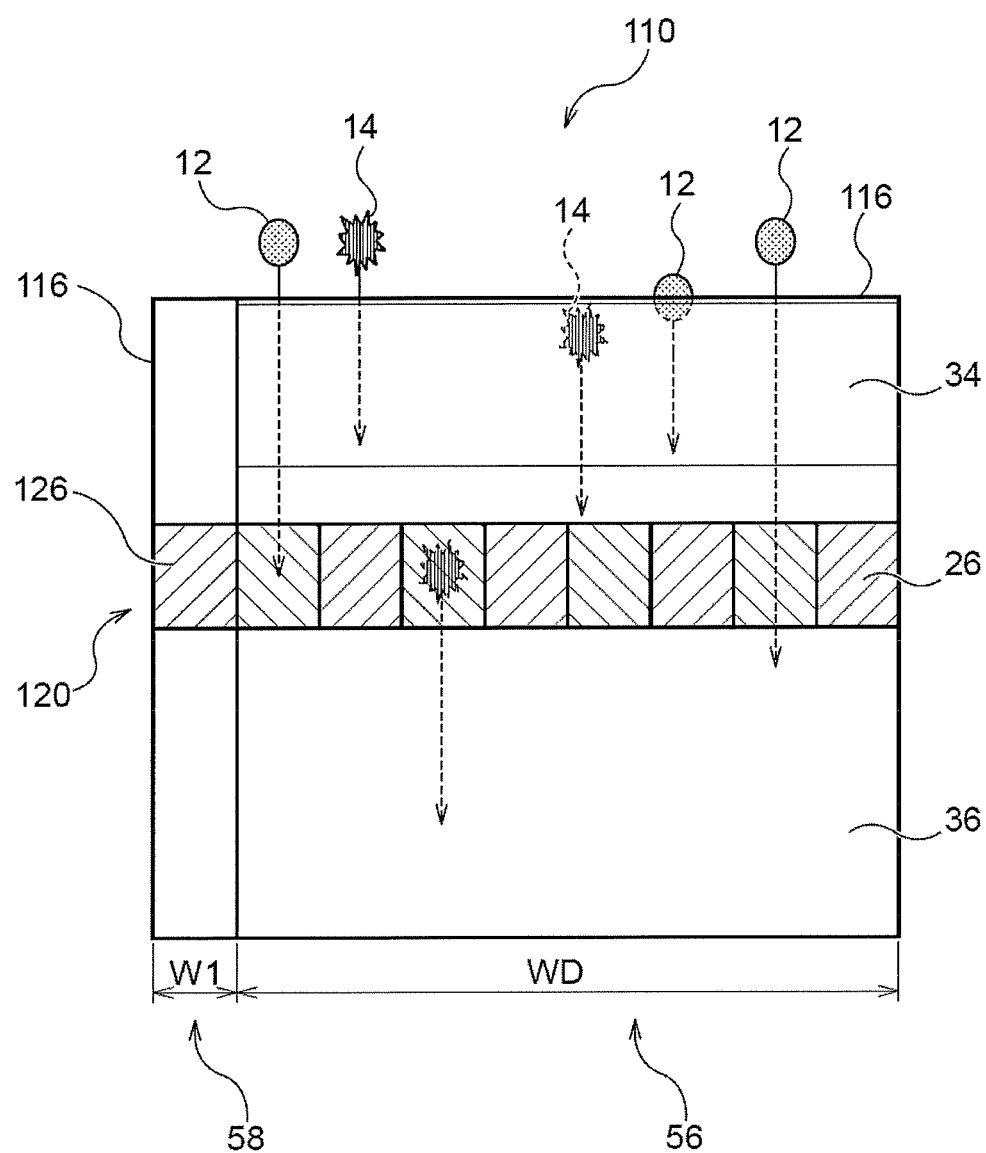
FIG. 9 is a front view of a contaminant detection system 110 according to another embodiment of the present invention.

FIG. 9 is a front view of a contaminant inspection system 110. In this embodiment, the contaminant detection system 110 has a detection module 56 and a reference module 58. The detection module 56 detects any metal contaminant 14 mixed in a powder product (object under detection) 12 such as pharmaceutical or food. The structure of the detection module 56 is the same as that of FIG. 1. The structure, shape, and arrangement of a feed machine 116 and a metal detection sensor 120 of the reference module 58 are the same as those of FIG. 1(*a*). The metal detection sensor 120 has two magnets 124 (not shown), 126 and one coil 130 (not shown).

In the reference module 58, no products or metal is fed to the feed machine 116. No products or metal thus passes the feed machine 116. In other words, no products or metal exists in the feed machine 116. The coil 130 outputs at all times a reference output 50 (Vref) indicative of the absence of product 12 and metal 14 while the detection module 54 is performing contaminant detection. The reference output is an induced electromotive force in this embodiment. In this embodiment also, the reference output is the signal 50 of FIGS. 8(*a*) and (*b*). The reference output 50 is transmitted to a detection circuit (not shown) for reference module for measuring the reference output 50. The detection circuit for reference module has the same circuit configuration as the detection circuit 48 described earlier. Matching the circuit configuration enables matching a noise characteristic, etc. While the detection module 56 conducts contaminant detection, the detection circuit for reference module measures the reference output 50 at all times or only on a command from the detection circuit 48.

The reference module 58 is in contact with, or in the vicinity of, an outer side of the detection module 56, i.e., the outside of the detection range WD. The range occupied by the reference module 58 is indicated by a detection module W1 of the reference module 58.

Now, a metal detection technique for detecting metal moving through the passageway 18 of the detection module 56, using the contaminant detection system 110 of FIG. 9, will be described.

During contaminant detection, when there is a possibility of metal 14 passing the detection range WD, the coil 130 outputs the reference output 50 to the detection circuit for reference module at all times. The detection circuit for reference module measures the reference output at all times. The detection circuit for reference module transmits the reference module 50 to the detection circuit 48 described earlier. The detection circuit 48 uses the coil 30, disposed at the position of the product 12 (detection range), to measure a detection output (induced electromotive force (Vmetal)) from the coil 30. The detection signal is the signal 52, 54 of FIGS. 8(a) and (b).

The detection circuit 48 calculates the difference in output Vdef (=Vmetal−Vnonmental) between the reference output 50 (Vref) and the detected output 52, 54 (Vmetal) and determines that metal is contained in the object under inspection when it is greater than or equal to a predetermined value. In the case of the signal 54, the output difference Vdef is negative (minus); thus, its absolute value will be used for comparison with a predetermined threshold value. The detection circuit 48 transmits a signal indicative of the detection to a controller controlling an air gun.

The metal detection sensor 120 of FIG. 9 may be thought of as a noise cancellation sensor. The differential between the output from the metal detection sensor 120, separate from the metal detection sensor 20, which actually detects metal, and the output from the metal detection sensor 20 can be used to remove noise effects.

Since the output from the metal detection sensor 120 is a reference value when no metal contaminant 14 is present, the differential or output ratio between the output from the metal detection sensor 120 and the output from the metal detection sensor 20 can be used to detect the presence of metal 14. The output from the metal detection sensor 120 and the output from the metal detection sensor 20 are the amplitude, frequency, or phase of the detection signal or a change in detection signal impedance. The differential or ratio of such quantities is used. Such use of differential or ratio is also possible with the configuration of FIGS. 13 to 17 described later.

Figure 10:
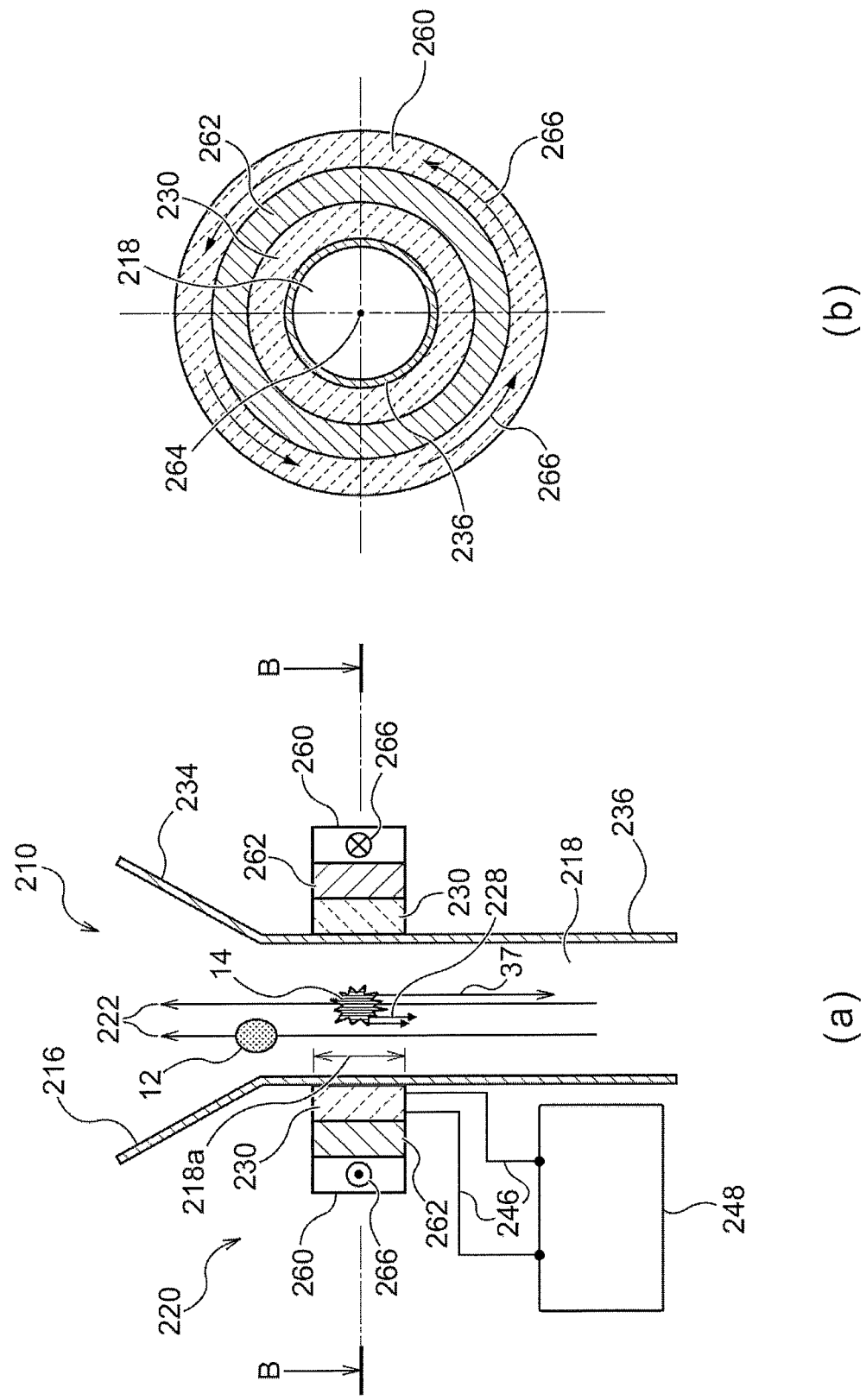
FIG. 10 is a longitudinal and a transverse cross sectional view of a contaminant detection system 210 according to still another embodiment of the present invention.

Next, still another embodiment of the present invention will be described with reference to FIG. 10. FIG. 10 is a longitudinal cross sectional view and a transverse cross sectional view of a contaminant detection system 210 according to the still another embodiment of the present invention. In this embodiment, the contaminant detection system 210 comprises: a feed machine 216 through which product 12 and metal 14 flow; and a metal detection sensor 220 for detecting metal 14 mixed in the product 12 moving through a passageway 218 of the feed machine 216. The sensor 220 comprises an excitation coil 260, a magnetic body 262, and a detection coil 230, disposed around the passageway 218 to surround it.

The excitation coil 260 and the magnetic body 262 form an electromagnet that sets up a magnetic field 222. The magnetic body 262 is an iron core (core) of the electromagnet and is used to increase the magnetic field 222, compared with that in the absence of the iron core. The material for the magnetic body 262 is a metal for generating a forward magnetic field, such as iron or ferrite. The detection coil 230 detects a reverse magnetic field 262 as the metal 14 passes the magnetic field 222 generated by the excitation coil 260 and the magnetic body 262. Although the metal 14 shown in FIG. 10 generates a reverse magnetic field, this embodiment may be applied to a metal 14 that generates a forward magnetic field.

The feed machine 216 comprises: an inlet section 234 that is V-shaped, as shown in the longitudinal cross sectional view of FIG. 10(a); and a detector section 236 disposed downstream of the inlet section 234 and provided with a metal detection sensor 220. The metal detection sensor 220 is disposed on an outer wall of the detector section 236. The inlet 234 is funnel-shaped, and the detector section 236 is of cylindrical shape. The passageway 218 is circular in shape, as viewed from the top of FIG. 10. Although the cross section of the passageway is circular in this embodiment, this embodiment is not limited to this shape of the passageway and may instead be provided with a passageway of rectangular or other polygonal cross-sectional shape or any other suitable cross-sectional shape.

The product 12 is fed from the top of the feed machine 216 and then free-falls due to gravity and is inspected at the detector section 236 for the presence of metal contaminant 14. The material for the inlet section 234 and the detector section 236 is a nonconductive material such as plastic. The detector section 236 has an inner diameter, e.g., 1 cm.

Downstream of the detector section 236 are provided an air gun and a branch similar to those of FIG. 2. When the metal detection sensor 220 detects metal 14, a signal indicative of the detection is sent via a detection circuit 248, connected to the metal detection sensor 220, to a controller (not shown) for controlling the air gun.

The excitation coil 260, the magnetic body 262, and the detection coil 230 of the metal detection sensor 220 are concentrically centered at a common central axis 264. The direction 266 of electric current through the excitation coil 260 is arbitrary and, in FIG. 10, is counterclockwise as viewed in FIG. 10(b) to generate the upward magnetic field 222. The excitation coil 260, the magnetic body 262 generating forward electric field, the detection coil 230, and the detector section 236 are fixed together by adhesive, threaded engagement, mutual fit, or the like.

The excitation coil 260, the magnetic body 262 generating forward magnetic field, the detection coil 230, and the detector section 236 may vary in size or shape, depending on the size of metal fragments to be detected. The arrangement of the excitation coil 260, the magnetic body 262 generating forward magnetic field, and the detection coil 230 and the number of each of them are not limited to those shown in FIG. 10.

For example, the excitation coil 260 and the magnetic body 262 may be disposed radially inward of the detection coil 230. Alternatively, the excitation coil 260, the magnetic body 262, and the detection coil 230 may be disposed along the axial direction 264, i.e., in the vertical direction in FIG. 10 (a). Although the excitation coil 260, the magnetic body 262, and the detection coil 230 are used one each in FIG. 10, but there may instead be more than one of each.

Figure 11:
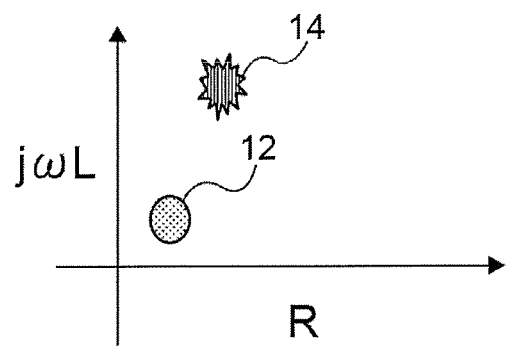
FIG. 11 is a graph of the output of a detection coil for a metal generating a reverse magnetic field.

From the detection coil 230 is transmitted an output 246 to a detection circuit 48 shown in FIG. 10(a). An example of the output 246 of the coil 230 is shown in FIG. 11. FIG. 11 is a graph of an output for a metal generating a reverse magnetic field. In this embodiment, for measurement of a complex impedance, the horizontal axis of the graph represents the real part of the complex impedance, and the vertical axis represents the imaginary part of it. The circle labeled product 14 represents the output 246 of the detection coil 230 in the absence of metal contaminant, and the circle labeled metal 12 represents the output 246 of the detection coil 230 in the presence of metal.

Next, a metal detection technique for detecting the metal 14 passing through the passageway 218, using the metal detection sensor of FIG. 10, will be described.

First, a product 12 that is known to have no metal 14 is fed to the feed machine 216 to measure the output (complex impedance) of the detection coil 230, using the detection circuit 248. The detection circuit 248 then stores this as a reference output (Vnonmetal) in unillustrated internal memory. Next, a product 12 potentially contaminated with metal 14 is fed to the feed machine 216, and the complex impedance, referred to as a detection output (Vmetal), is then measured with the detection circuit 248. The detection circuit 248 measures the output difference (Vdef) (=Vmetal−Vnonmetal) between the reference output and the detection output.

If the output difference reaches or exceeds a predetermined value (preset threshold value), the detection circuit 248 determines that the product 12 contains metal. The detection circuit 248 then sends a signal indicative of detection to the controller (not shown) for controlling the air gun. The controller controls the air gun 38 to discharge air, thereby throwing the metal 14 into the branch. In this way, the metal is set apart.

When a difference (variation) in impedance is measured in the above-described manner, the impedance, consisting of a real and an imaginary part, may be thought of as a vector. Any one or combination of the amplitude of the real part (real value) and the amplitude of the imaginary part (real value) of the vector and the absolute value and argument of the vector can be used to determine the presence or absence of metal or whether the metal generates a forward or a reverse magnetic field.

Figure 12:
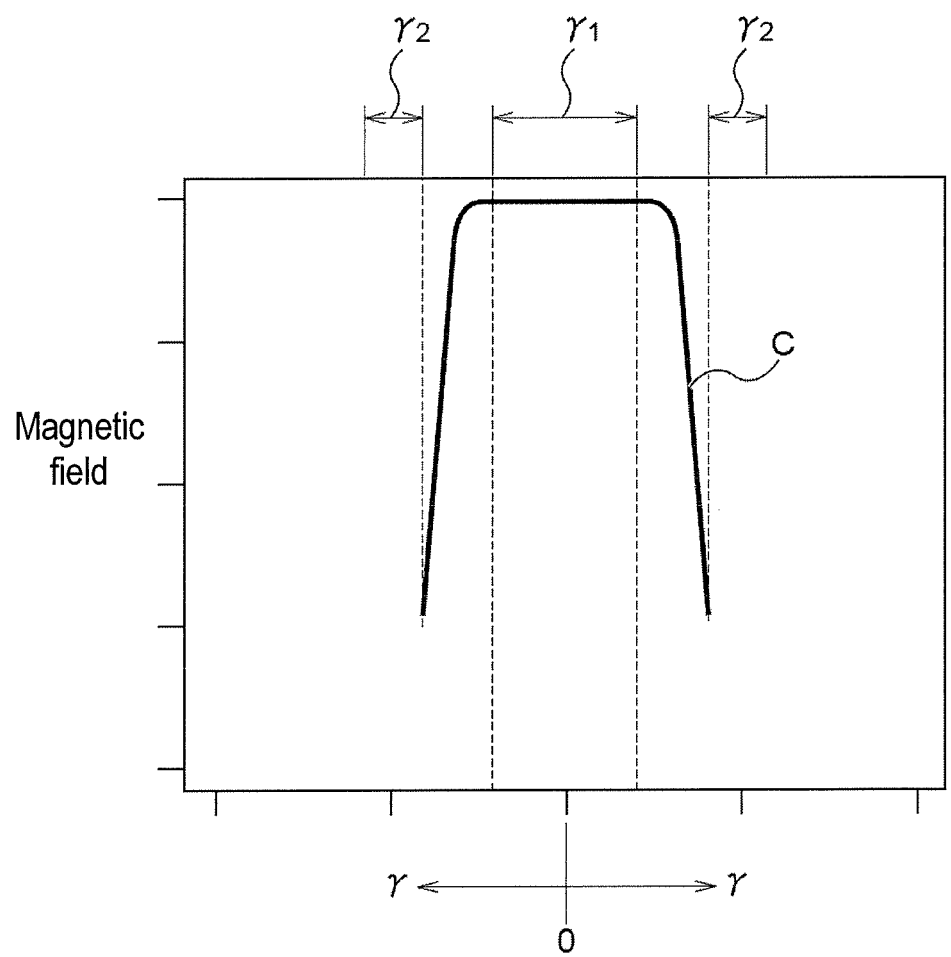
FIG. 12 shows a radial distribution of the amplitude of magnetic field 222 at the section 218a as seen in the cross sectional view of FIG. 10(b).

The embodiment of FIG. 10 brings about the following effect. The metal 14 is detected with the excitation coil 260 at a section 218a of the passageway 218 where the excitation coil 260 is located. The distribution of the level of the magnetic field 222 generated by the excitation coil 260 in the section 218a is conceptually illustrated in FIG. 12. FIG. 12 shows the distribution of the radial magnitude of the magnetic field 222 in the section 218a in the cross sectional view of FIG. 108(b). The horizontal axis represents the radial distance from the center r=0 of the passageway 218. The vertical axis represents the magnitude of the magnetic field 222. The curve c represents a distribution of the magnitude of the magnetic field 222 generated by the excitation coil 260. In FIG. 12, the region indicated by arrow r1 denotes the interior of the passageway 18, the region indicated by arrow r2 denotes the range of the excitation coil 260.

As shown in FIG. 12, the magnitude of the magnetic field 222 is maximum at the center of the passageway 218 and high in the passageway. The greater the magnetic field 222, the greater the magnetic field 228 as the metal 14 passes the passageway 218, resulting in a larger change in magnetic field 222 (=magnetic field 222 minus magnetic field 228). This facilitates detection of the metal 14. In the embodiment of FIG. 10, the region where the magnetic field 222 is large lies in the passageway 218, providing an advantage of facilitating the detection of fine metal fragments.

Although the embodiment of FIG. 10 does not use a permanent magnet, a permanent magnet may be provided along the inner and/or outer circumference of the excitation coil 260 so as to surround the passageway 218. This increases the magnetic field 222, facilitating the detection of fine metal fragments. The excitation coil 260 and the magnetic body 262 may be replaced with a permanent magnet.

Now, a structural example of the detection circuit 48 of FIG. 1 and the detection circuit 248 of FIG. 10 will be described. The detection circuit 48 of FIG. 1 measures induced electromotive force, and the detection circuit 248 of FIG. 10 measures complex impedance. These measurements are known and may be taken by any known technique. The detection circuit 48 of FIG. 1 may instead be adapted to measure complex impedance, and the detection circuit 248 of FIG. 10 may be adapted to measure induced electromotive force.

One way of measuring induced electromotive force is to attach the two outputs 46, 246 of the coil 30, 230 to opposite ends of a resistor and measure the voltage across the resistor, using an AC voltmeter.

Figure 13:
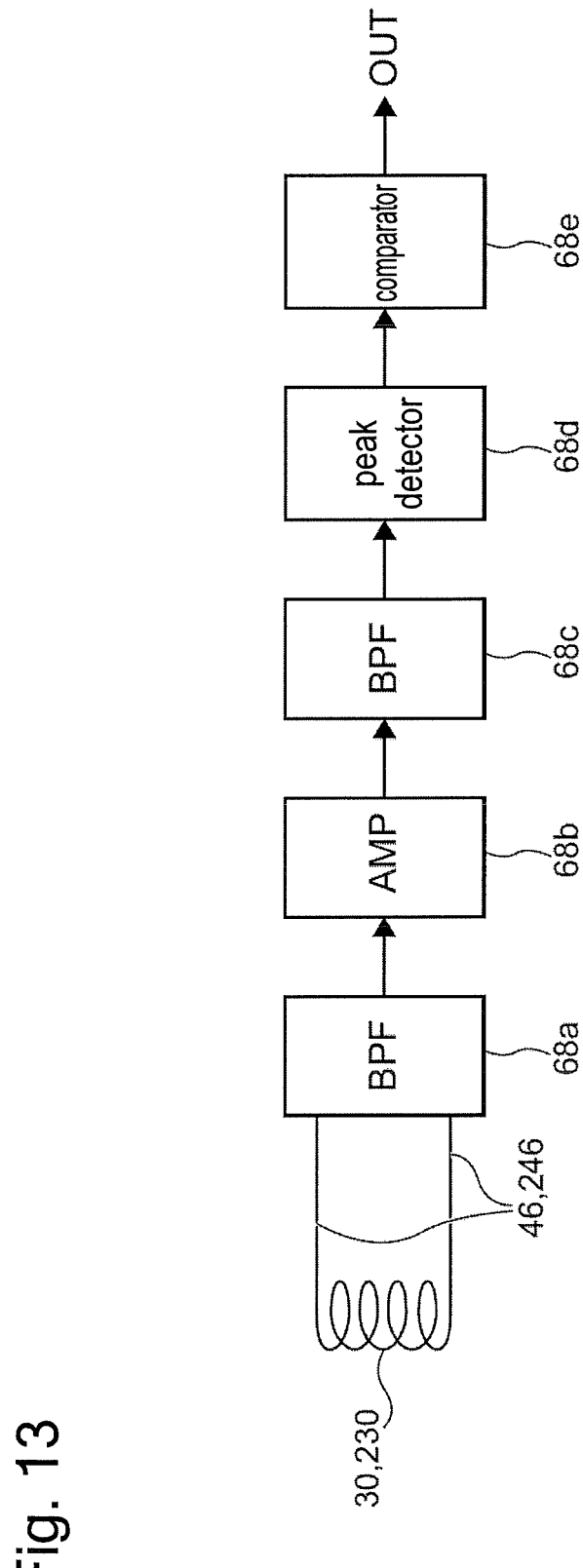
FIG. 13 is a block diagram of a circuit for measuring induced electromotive force.

Another way of measuring induced electromotive force is shown in FIG. 13. FIG. 13 is a block diagram of a circuit for measuring induced electromotive force. The two outputs 46, 246 of the coil 30, 230 are input to a bandpass filter (BPF) 68a to pick up only a signal within a certain bandwidth (a signal within a bandwidth that includes a signal generated by the metal 14). The purpose of the bandpass filter is to cut out noise signal outside the certain bandwidth.

Such noise signals include power source noise and electric noise generated by the contaminant detection system. The power source noise mainly has a frequency of 50 Hz or 60 Hz. These noises may be filtered out with a low-pass filter, a high-pass filter, a latch filter, or the like or a combination thereof, instead of the above-described bandpass filter. These filters may be used in the detection circuit of FIGS. 14 to 17, which will be described later. Such filters are omitted from FIGS. 14 to 17 of the detection circuit.

The output from the bandpass filter 68a is input to an amplifier (AMP) 68b for amplification. Thereafter, the output is input to the bandpass filter (BPF) 68b to select again only a signal within a certain bandwidth (a signal within a bandwidth including a signal produced by the metal 14). The output from the bandpass filter 68b is input to a peak detector (AMP) 68c to detect a peak value. The detected peak value is input to a comparator 68c. The comparator 68e compares the peak value and a predetermined value (the above-described reference output), thereby determining whether the peak value is greater than the predetermined value. If the peak value is greater than the predetermined value, the difference from the predetermined value will be output from the comparator 68e.

Figure 14:
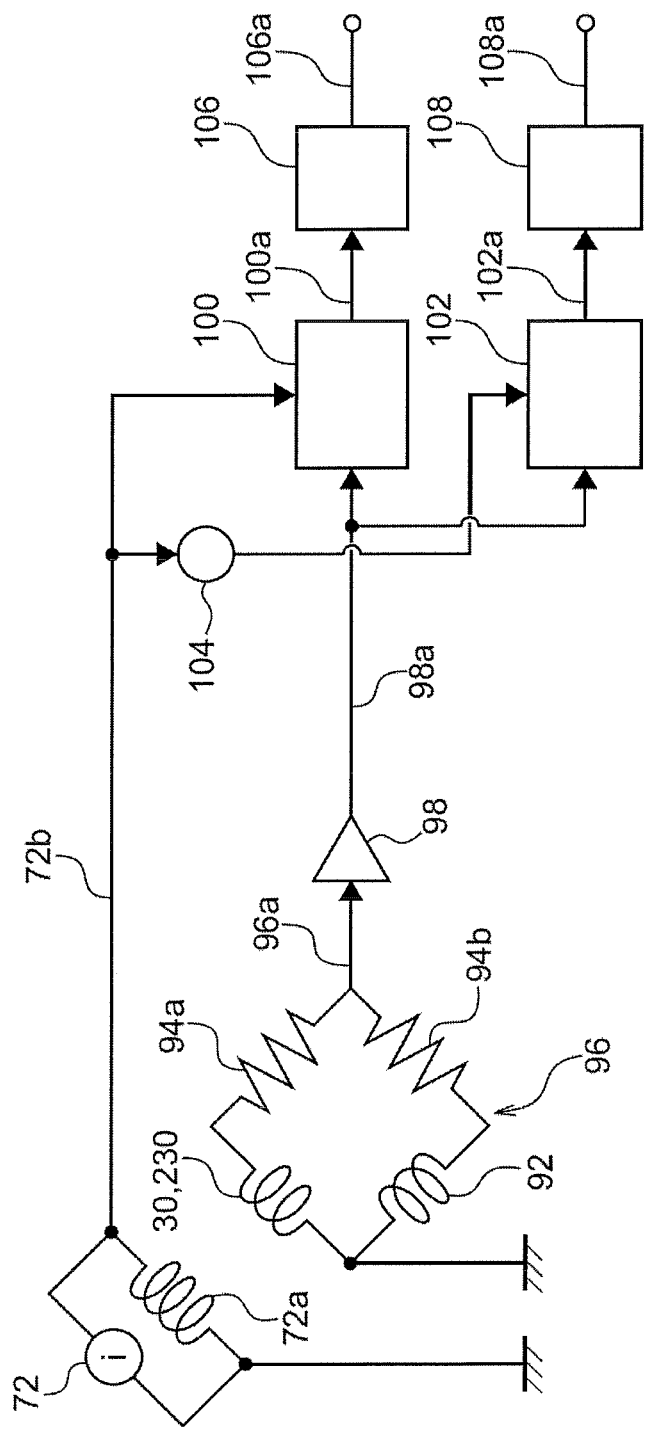
FIG. 14 is a block diagram of a circuit for measuring complex impedance.

One way of measuring complex impedance is shown in FIG. 14. FIG. 14 is a block diagram of a circuit for measuring complex impedance. This circuit uses a phase detection circuit. The reason for using the phase detection circuit is as follows.

The phase detection circuit performs phase detection of a signal of predetermined frequency only, which is subsequently processed with a low-pass filter having integral effect, so as to take the average of the detected signal. This allows the phase detection circuit to efficiently remove a signal having a frequency that is not the predetermined frequency, i.e., noise. As such, the phase detection circuit permits signal detection that is insusceptible to noise. Using the low-pass filter, the phase detection circuit is capable of picking up a minute signal drowned in noise, or having a signal level lower than noise. The phase detection circuit lends itself to a sensor for capturing a small phase shift in AC signal. Two reference signals orthogonal in phase to each other, i.e., 90 degrees out of phase, may be used to determine the levels of two orthogonal components (the real and imaginary parts of complex impedance) of detection signal.

Let us now consider, for example, a case of detecting the amplitude A and the phase difference α of signals to be detected, i.e., A sin (ωt+α). In this case, a phase detection circuit may be used to measure those quantities. The phase detection circuit multiplies the signals to be detected, by sin (ωt) and cos (ωt) signals (reference signals 90 degrees out of phase), and the signals thus obtained are processed, for example, with a low-pass filter. The reference signals have the same frequency as that of a signal allowed to directly flow through the coil 30 to serve as an exciting current. Alternatively, by applying an exciting current to an excitation coil that is not the coil 30 and applying a magnetic field generated by the excitation coil to the coil 30, a signal having the same frequency as that of that exciting current can be used as a reference signal. In the following embodiment, an exciting current itself is used as a reference signal in the phase detection circuit.

The phase detection circuit outputs the real part (a) and the imaginary part (b) of complex impedance, from which output the amplitude A $(=\sqrt{(a^2+b^2)})$ and the phase difference α(=tan−1(b/a)) of signals to be detected will be determined eventually. The phase detection circuit is characterized by its capability of detecting a signal of predetermined frequency having the same frequency as that of an excitation signal and amplifying the signal of predetermined frequency. This makes it possible to detect a minute signal drowned in noise or perform high-sensitivity signal detection.

FIG. 14 shows that an excitation coil 72a, separated from the coil 30, 230, is subjected to an exciting current from an exciting current source 72, and a magnetic field generated by the excitation coil 72a is applied to the coil 30, 230. The excitation coil 72a is preferably disposed coaxial and/or concentric with and adjacent to the coil 30, 230. The excitation coil 72a disposed on the opposite or the same side of the passageway 18 to or as the coil 30, 230.

In the circuit of this figure, the detection coil 30, 230 forms a bridge circuit 96 with a dummy inductance 92 and resistors 94a, 94b. The purpose of the bridge circuit 96 is to achieve high precision detection. An output voltage 96a of the bridge circuit 96 is input to amplifier 98 and thus amplified. An amplified signal 98a is input to phase detectors 100, 102 for detecting the real part (a) and the imaginary part (b) of complex impedance, respectively.

To the phase detectors 100, 102 is input an exciting current 72b from the exciting current source 72 to serve as a reference signal. The exciting current 72 to be input to the phase detector 102 is processed by a 90-degree phase shifter 104 for a 90-degree phase shift and then input to the phase detector 102. Outputs 100a, 102 from the phase detectors 100, 102 are input to low-pass filters 106, 108, respectively. Outputs 106a, 106b from the low-pass filters 106, 108 are the real part (a) and the imaginary part (b) of the complex impedance, respectively. The outputs 106a, 106b of the low-pass filters 106, 108 are input to a downstream processing circuit (not shown) that, in turn, determines an amplitude A $(=\sqrt{(a^2+b^2)})$ and a phase difference α(=tan−1(b/a)).

Figure 15:
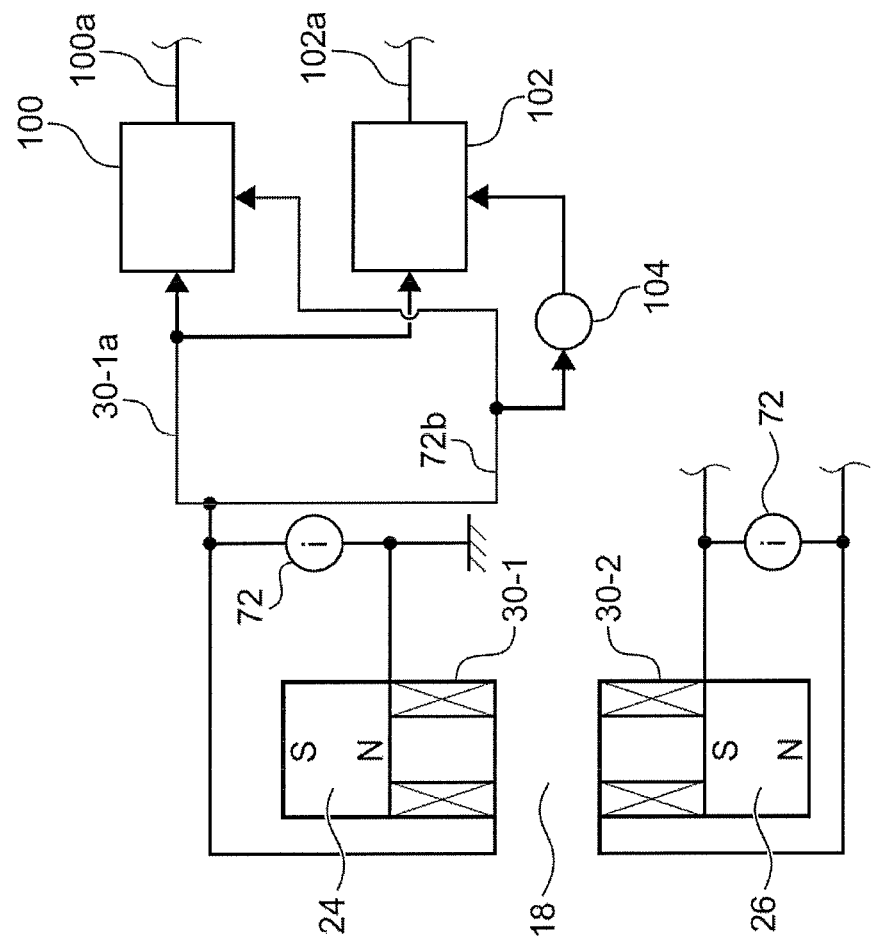
FIG. 15 is a block diagram of a circuit for measuring complex impedance.

Another way of measuring complex impedance is shown in FIG. 15. FIG. 15 is a block diagram of a circuit for measuring complex impedance. This circuit uses the coil 30 itself as an excitation coil. An exciting current flows from the exciting current source 72 to coils 30-1, 30-2. In FIG. 15, the coils 30-1, 30-2 are opposed via the passageway 18 so that they are on the passageway 18 sides of magnets 24, 26. In this figure, as in FIG. 14, a phase detection circuit is used. Without a bridge circuit, the real part (a) and the imaginary part (b) of complex impedance of the coils 30-1, 30-2 are detected directly. Since the complex impedance of the coil 30-1 and the complex impedance of the coil 30-2 are detected in a similar manner with a single separate circuit, detection of the complex impedance of the coil 30-1 will be described below.

The output voltage of the coil 30-*la* is input to the phase detectors 100, 102 for detecting the real part (a) and the imaginary part (b) of complex impedance, respectively. To the phase detectors 100, 102 is input the exciting current 72b from the exciting current source 72 as a reference signal. The exciting current 72b input to the phase detector 102 is processed by a 90-degree phase shifter 104 for a 90-degree phase shift and then input to the phase detector 102. The manner in which the phase detectors 100, 102 process the outputs 100a, 102a will not be illustrated or described, since it is the same as that shown in FIG. 14.

The difference between the detection circuit of FIG. 15 and those of FIGS. 13, 14 is, as described above, whether or not to apply the exciting current 72b to the detection coil 30, 230. In FIGS. 13, 14, exciting current is not applied to the detection coil. In FIG. 15, the exciting current 72b is applied to the detection coil 30, 230, and a signal to which the exciting current 72b is added is processed.

Figure 16:
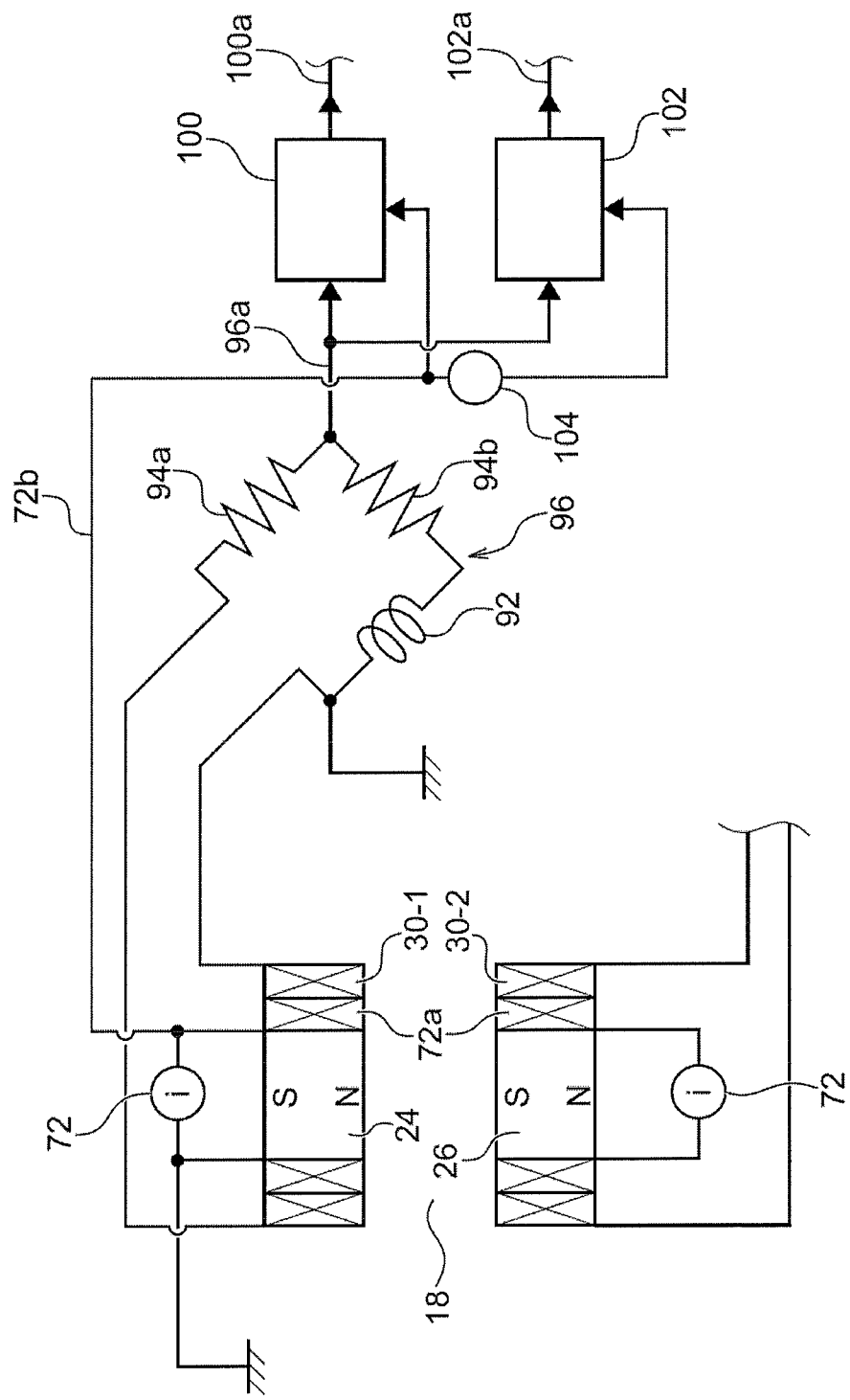
FIG. 16 is a block diagram of a circuit for measuring complex impedance.

Next, another way of measuring complex impedance is shown in FIG. 16. FIG. 16 is a block diagram for measuring complex impedance. This circuit allows an exciting current to flow from the exciting current source 72 into the excitation coil 72a, separate from the coil 30, and applies a magnetic field generated by the excitation coil 72a to the coil 30. The excitation coil 72a is coaxial and concentric with and adjacent to the coil 30. In FIG. 16, the coils 30-1 and 30-2 are opposed via the passageway 18 and are coaxial and concentric with the magnets 24, 26. In this figure, a phase detection circuit, as in FIG. 14, is used. Since the complex impedance of the coil 30-1 and the complex impedance of the coil 30-2 are detected in a similar manner with a single separate circuit, the complex impedance of the coil 30-1 will be described below.

In the circuit of this figure, the detection coil 30-1 forms a bridge circuit 96 with a dummy inductance 92 and resistors 94a, 94b. An output voltage 96a of the bridge circuit 96 is input to amplifier 98 and thus amplified. The amplified signal 98a is input to phase detectors 100, 102 for detecting the real part (a) and the imaginary part (b) of complex impedance, respectively. To the phase detectors 100, 102 is input the exciting current 72b from the exciting current source 72 as a reference signal. The exciting current 72b input to the phase detector 102 is processed with a 90-degree phase shifter 104 for a 90-degree phase shift and then input to the phase detector 102. The manner in which the phase detectors 100, 102 process the outputs 100a, 102a will not be illustrated or described, since it is the same as that shown in FIG. 14.

Figure 17:
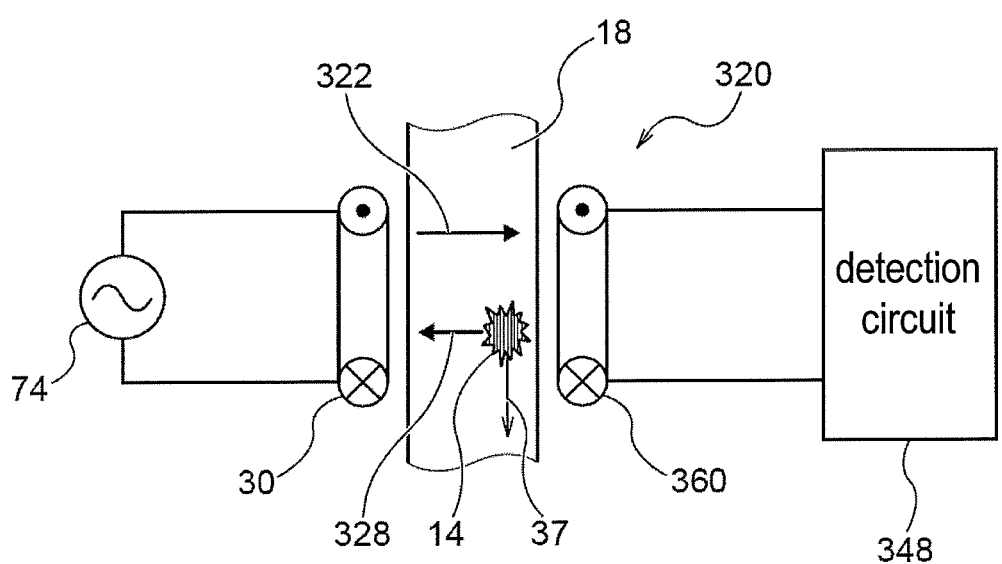
FIG. 17 is a longitudinal cross sectional view of a contaminant detection system according to still another embodiment of the present invention.

Now, a contaminant detection system according to still another embodiment of the present invention will be described with reference to FIG. 17. This contaminant detection system has a metal detection sensor 320 having a similar configuration to both of the metal detection sensors of FIGS. 1 and 10. FIG. 17 is a longitudinal cross sectional view of the contaminant detection system according to still another embodiment of the present invention. This embodiment uses an excitation coil 360, instead of the magnet 26 of FIG. 4(*a*). The metal detection sensor 320 has detection coil 30 and the excitation coil 360 opposed via the passageway 18 of FIG. 1, but, unlike the embodiment of FIG. 1, does not have a magnet. As in FIG. 10, the metal detection sensor 320 has the excitation coil 360, but the excitation coil 360, unlike the embodiment of FIG. 10, does not have a magnetic body.

The excitation coil 360 is supplied with an alternating current from an alternating current source 74 to generate a magnetic field 322. If the metal 14 is a metal generating a reverse magnetic field, a reverse magnetic field 328 is generated as the metal 14 passes through the magnetic field 322. The detection coil 30 detects this reverse magnetic field 328 and inputs its output to a detection circuit 348. The detection circuit 348 sends a signal indicative of the detection of the metal 14 to a controller controlling an air gun. The excitation coil 360 is excited by an alternating current, but not by a direct current. The reason for such excitation by an alternating current is that the alternating current facilitates signal processing.

Now, another embodiment of the present invention will be described with reference to FIG. 18. FIG. 18 is a plan view of a contaminant detection system according to another embodiment of the present invention. The metal detection sensor of this embodiment uses a magnetic member 76 to connect the magnets 24, 26 opposed to each other via the passageway 18.

The metal detection sensor comprises: the magnet 24 (first magnet) and the magnet 26 (second magnet) generating a static magnetic field 22; and the coil (first magnetic-field sensor) for detecting a magnetic field generated by a metal 14. The magnets 24, 26 are opposed on opposite sides of the passageway 18.

The magnet 24 is located outside of the magnet 26 along the axial direction connecting the N pole and S pole of the magnet 26, and the magnet 26 is located outside of the magnet 24 along the axial direction connecting the N pole and the S pole of the magnet 24. The coil 30 and the magnet 26 are opposed on the opposite sides of the passageway 18. The coil 30 is located outside of the magnet 26 along the axial direction connecting the S pole and the N pole of the magnet 26, and the magnet 26 is located outside of the coil 30 along an axial direction perpendicular to a magnetic-field detection surface of the coil 30. The metal detection sensor has a magnetic member 76 connecting the poles of the magnets 24, 26 on the opposite sides of them to the passageway 18.

More specifically, in the case of FIG. 18, the magnetic member 76 connects the S pole of a magnet 24-1 and the N-pole of a magnet 26-1 to each other; the N pole of a magnet 24-2 and the S pole of a magnet 26-2 to each other; . . . , and the N pole of a magnet 24-$i$ and the S pole of a magnet 26-$i$ to each other.

The embodiment of FIG. 1 does not use the magnetic member 76. In other words, the embodiment of FIG. 1 does not connect the poles of each pair of opposed magnets 24, 26 on the opposite sides to the passageway 18. The use of the magnetic member 76, as shown in FIG. 18, brings about the effect of a significantly larger magnetic field 22 than that of the embodiment of FIG. 1.

This significant increase in magnetic field 22 is due to a significant drop in magnetic reluctance of each magnetic circuit produced by the opposed magnets 24, 26 of each pair resulting from the magnetic member 76 connecting the poles of the magnets 24, 26 on the opposite sides to the passageway 18. The magnetic member 76 uses an iron plate 76 or the like (with a silicon steel plate or a lamina of amorphous material mounted thereon) to loop-connect the magnets 24, 26. Connecting the rear sides of the magnets 24, 26 via the iron plate 76 makes the iron plate 76 a magnet, resulting in an increase in magnetic force acting in the passageway 18, compared with the absence of the iron plate 76. As shown in FIG. 18, the magnetic fluxes 78, 78$a$, and 78$b$ in the magnetic member 76 form a loop with the magnetic flux 22.

The opposed magnets 24, 26, e.g., the magnets 24-1 and 26-1 and the magnets 24-$i$ and 26-$i$, are connected by the magnetic member 76. Other magnets 24-2 and 26-2, etc., are also indirectly connected by the magnetic member 76. In other words, the poles of adjacent magnets 24 on the opposite side to the passageway 18 are connected by a magnetic member 76$a$ (first magnetic member). Similarly, a magnetic member 76$b$ (second magnetic member) connects the poles of adjacent magnets 26 on the opposite side to the passageway 18. In the case of FIG. 18, the magnetic member 76$a$ connects, for example, the S pole of the magnet 24-1 and the N pole of the magnet 24-2, and the magnetic member 76$b$ connects, for example, the N pole of the magnet 26-1 and the S pole of the magnet 26-2. The magnetic member 76 is shaped to surround the outer circumference of the magnets 24, 26.

The magnetic members 76, 76$a$, 76$b$ may be an integrally molded component or separate parts. In the case of separate parts, the separate parts are integrally combined by bolts or an adhesive. The magnetic members 76$a$, 76$b$ may be connected to the magnets 24, 26 by bolt fastening, adhesive fixation, or the like.

The magnet 24, located outside of the magnet 26 along the axial direction connecting the N- and S-pole of the magnet 26, the magnet 26, located outside of the magnet 24 along the axial direction connecting the N- and S-pole of the magnet 24, and the coil 30, located on the outside along the axial direction connecting the N- and S-pole of the magnet 26, form one set. There a plurality of such sets disposed in parallel to each other along the width of the passageway 18. The plurality of sets may instead be staggered in the direction of the width of the passageway 18, as shown in FIG. 6. The magnetic fields generated by adjacent sets are antiparallel to each other. That is, magnetic fields 22-1 and 22-2 are antiparallel to each other, and so are magnetic fields 22-2 and 23-3. This antiparallel configuration connects adjacent magnets via the shortest distance, facilitating the connection of the magnetic members 76$a$, 76$b$ and the magnets 24, 26. The magnetic fields from adjacent sets may instead be parallel to each other. In such a parallel case, adjacent sets are not connected by the magnetic material 76.

The orientation of each magnet (S→N) shown in FIG. 18 is one example. The magnet orientation may instead be opposite (N→S) to the one shown in FIG. 18. In this case, the direction of magnetic field lines is reversed. But the magnitude of magnetic fields remains unchanged, and this will not affect metal detection.

Now, another embodiment of the present invention will be described with reference to FIG. 19. FIG. 19 is a plan view of a contaminant detection system according to another embodiment of the present invention. The metal detection sensor of this embodiment has a coil 31 (second magnetic-field sensor), the coil 31 and the magnet 24 being opposed on the opposite sides of the passageway 18. The coil 31 is located outside of the magnet 24 along the axial direction connecting the N- and S-pole of the magnet 24. The magnet 24 is located outside of the coil 31 along an axial direction perpendicular to a magnetic-field detection surface of the coil 31.

Next, another embodiment of the present invention will be described with reference to FIG. 20. FIG. 20 is a plan view of a contaminant detection system of another embodiment of the present invention. The metal detection sensor of this embodiment has the coil 30 wound around the magnet 24, and the coil 31 is wound around the coil 26. In this embodiment, the distance between the magnets 24 and 26 is shorter than those of the embodiments of FIGS. 18 and 19, so that with the same magnets 24, 26, the magnitude of the magnetic field 22 is larger than those of the embodiments of FIGS. 18 and 19. Comparing FIGS. 18 and 20, FIG. 20 shows the coils 30, 31 on the opposite sides of the passageway 18, resulting in the detection sensitivity achieved by the configuration of FIG. 20 being higher than that of FIG. 18.

Next, another embodiment of the present invention will be described with reference to FIG. 21. FIGS. 21(a) and 21(b) are plan views of a contaminant detection system of this embodiment. The metal detection sensor of this embodiment comprises: a plurality of magnets 24 (first magnets) generating static magnetic fields, disposed on one side of the passageway 18 along the direction of the width WD of the passageway 18; and coils 30 (first magnetic-field sensors) for detecting a magnetic field generated by the metal 14. The plurality of magnets 24 are disposed in one row such that the axis connecting the N- and S-pole of each magnet 24 points in the same direction. Of two adjacent magnets 24, e.g., magnets 24-1 and 24-2, the polarity, i.e., S-pole, of one magnet 24-1, disposed on the side of the other magnet 24-2, is the same as the polarity, i.e., S-pole, of the other magnet 24-2, disposed on the side of the one magnet 24-1. The coils 30 are disposed on one side of the passageway 18.

The metal detection sensor comprises: a plurality of magnets 26 (second magnets) generating static magnetic fields, disposed on another side of the passageway 18; and coils 31 (second magnetic field sensors) for detecting a magnetic field generated by the metal 14, the coils 31 being disposed on another side of the passageway 18. The plurality of magnets 26 are disposed in one row such that the axis connecting the N- and S-pole of each magnet 26 points in the same direction. Of two adjacent magnets 26, e.g., magnets 26-1 and 26-2, the polarity, i.e., S-pole, of one magnet 26-1, disposed on the side of the other magnet 26-2, is the same as the polarity, i.e., S-pole, of the other magnet 26-2, disposed on the side of the one magnet 26-1.

Disposing the magnets 24, 26 in a transverse direction makes it possible to provide a high surface magnetic flux density. The magnets 24, 26 are so arranged that the direction connecting the N- and the S-pole of that magnets 24, 26 coincides with the direction 80 of the passage width WD. The direction connecting the N- and S-pole is shifted 90 degrees from that of the embodiments so far described. A small space 82 between the two adjacent magnets 24-1, 24-2 makes magnetic fields 80 in the passageway 18 strong.

Repulsive force acting between the opposed S-poles of two adjacent magnets 24, e.g., magnets 24-1, 24-2, arranged in a transverse direction, yields strong magnetic fields 80. Changing length t1, t2 of the magnets 24, 26 changes distances h1, h2 (range of magnetic force) of travel of magnetic field lines. Comparison between FIGS. 23(a) and 23(b) shows that the distances h1, h2 increase with increasing lengths t1, t2.

As such, the lengths t1, t2 between the N- and S-pole of the magnets 24, 26 determine the intensity of the magnetic fields 80 generated by the magnets 24, 26.

The above embodiments detect the presence or absence of metal. The sensor of the present invention is also capable of detecting the speed of a metal. The electromotive force induced by the metal 14 falling through a magnetic field is proportional to the product of the speed of descent, a dimension of the metal 14, the level of the magnetic field 22 generated by the magnets 24, 26. Therefore, if the dimension of the metal 14 and the level of the magnetic field 22 are known beforehand, the speed of descent can be obtained by measuring the level of the electromotive force induced by the metal 14 with the aid of the coil 30.

The dimensions of the metal 14 depend on its shape. If the metal has a planar shape, induced electromotive force varies, depending on the direction of the metal relative to the magnetic field 22. If, on the other hand, the metal 14 is spherical, the induced electromotive force remains the same, irrespective of the direction of the falling metal relative to the magnetic field 22.

The speed measurement is effective especially when the orientation or shape of the metal is known beforehand. The shape and orientation of the metal, if they are known, can be used to determine speed. In a contaminant test, for example if the metal 14 is known to have a different speed from that of the product 12, the speed measured is higher or lower than a predetermined value or falls within a predetermined range. This makes it possible to identify the metal 14.

The coil 30 for magnetic field detection may be an air-core coil, an iron-core-equipped coil, a ferrite-loaded coil, or a magnet-loaded coil.

The coil-wound structure may be a spiral winding, a solenoid winding, or a coil of pot core shape having a pointed end. FIG. 22 (a) shows a solenoid winding, and FIGS. 22(b) and 22(c) show a spiral winding. The solenoid winding has an iron core 84 with a wire 86 wound therearound. A first layer of wire 86 is wound around the iron core 84 over its entire axial length, and subsequently, a second layer of wire 86b is wound around the iron core 84 over its entire axial length. This winding operation is repeated to form a predetermined number of layers of winding. FIG. 22(a) shows the midst of winding the second layer. A surface 86c is a magnetic-field detection surface of the coil.

In the spiral winding, three coils 86a, 86b, and 86c of the coil 30 are coils each formed by spirally winding a wire ln in N layers in one row, where the row refers to the axial direction of the coil 30 and the layers refer to radial direction of the coil 30. The coils 88a and 88b are provided with a spacer S1 therebetween to keep a uniform space therebetween, and the coils 88b and 88c are provided with a spacer S2 therebetween to keep a uniform space therebetween. Although FIG. 22(b) shows three coils 86a, 86b, and 86c, the number is not limited to three, and at least one coil will be sufficient.

As shown in FIG. 22(c), the three coils 86a, 86b, and 86c are each a radially spiral coil of the wire ln wound in N layers lying in one row. FIG. 22(c) shows one of the three coils 86a, 86b, and 86c. The coil is wound around an iron core 110 so that the coil spirals radially outward from a winding start 112a on the iron core 110 up to a winding end 112a, which is connected to a winding start 112 of another coil.

The solenoid winding does not provide a large inductance unless the number of turns of winding is large. The solenoid winding thus has the disadvantages of a large bulk, a low Q factor representing the sharpness of a resonance peek, and a low resonance frequency. As a result, the solenoid winding has a lower detection sensitivity than a spiral winding. Since the solenoid winding, long along the axis of the coil, has the disadvantage of a greater distance between contaminant and coil. Also, the solenoid winding does not provide a large inductance unless an iron-core radius 86d is large, and thus has the disadvantage of a large size of coil due to the large diameter of the iron core 86d.

Because of the mutual inductance between the coils 86a, 86b, and 86c, the spiral winding has a large inductance for the size of its coils, compared with the solenoid winding. For this reason, the spiral winding can be provided with an iron core of smaller diameter than that for the solenoid winding. As a result, the spiral winding has a smaller overall coil radius than that of the core of the solenoid winding. Further, the spiral winding has the advantages of a high Q factor, due to a low stray capacitance, which factor represents the sharpness of a resonance peak, and a high resonance frequency. This enhances the detection sensitivity of the spiral winding, compared with the solenoid winding. Further, the spiral winding can be made short along the axis of the coil (i.e., the dimension in the direction of the row), providing the advantage of a shorter distance between contaminant and coil. Thus, in this respect also, the spiral winding has an improved detection sensitivity, compared with the solenoid winding.

Figure 23:
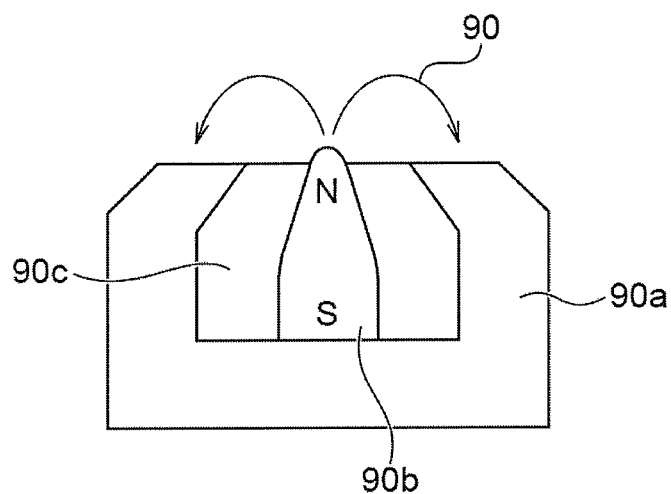
FIG. 23 shows an pot-shaped coil.

FIG. 23 shows an pot-shaped coil. This coil, unlike ordinary pot-shaped coils, is of pot core shape with a pointed end. A magnet 90b is placed around the center of an pot-shaped iron core 90a and is provided with a wire wound therearound to form a coil 90c. The magnet 90b has a pointed end, and so do the iron core 90a and the coil 90c. As a result, the magnetic field generated by the magnet is pointed so that the detection range can be narrowly concentrated. The magnet 90b may be replaced with soft iron, silicon steel plate, ferrite, permalloy, amorphous, or the like. The magnet 90b may even be omitted to form an air core.

Although the embodiments described so far relate to examples using a coil as a magnetic-field sensor, the coil may be replaced with a magnetic-field sensor, such as a magnetoresistive device, a Hall device, a magnetic impedance device (amorphous wire magnetic-field sensor).

Figure 24:
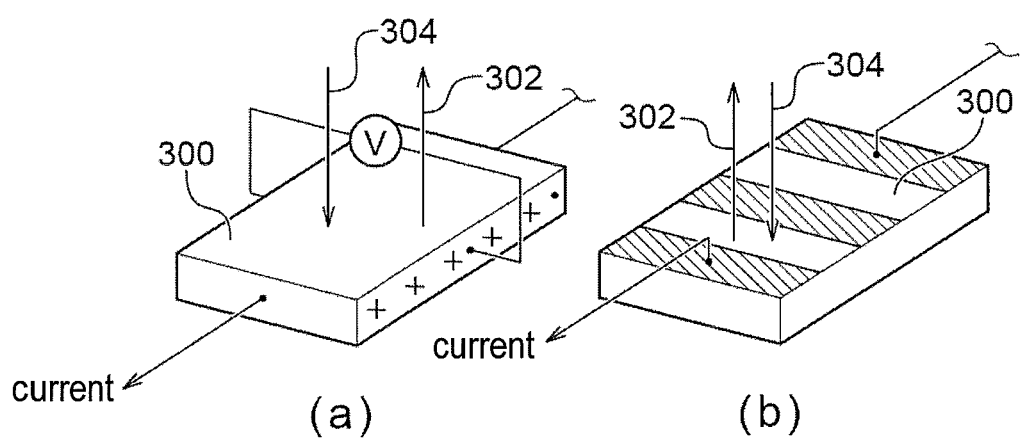
FIG. 24 shows a Hall device and a magnetoresistive device.

FIG. 24 shows a Hall device and a magnetoresistive device. FIG. 24(a) shows the Hall device and FIG. 24(b) the magnetoresistive device. A magnetic field 304 to be detected is present along an axis 302 perpendicular to a magnetic-field detection surface 300 of each device.

So far, the present invention has been described in terms of metal contaminant inspection. However, the present invention is not limited to such metal contaminant inspection and may be applied to inspection for a change in the thickness of metal film, which is not a contaminant, or the presence of a particular metal which is not a contaminant. For example, the present invention may be applied to CMP (chemical mechanical polishing). The CMP (chemical mechanical polisher) is a device widely used in the field of semiconductor manufacturing devices to polish the surfaces of substrates such as semiconductor wafers. The present invention may be applied to inspection in the CMP for a change in the thickness of metal film in circuits formed on wafers or for the presence of a certain metal in the circuits. If the magnets and magnetic-field sensor of a metal detection sensor are not opposed via a CMP polishing table (if it is imagined as the passageway 18, e.g., the configurations shown in FIGS. 4(b), (c), and (e)), that is, if a plurality of magnets and coil are disposed on only one side of the polishing table, the present invention may be applied to CMP.

REFERENCE SIGNS LIST 10. contaminant detection system
12. product
14. metal
20. metal detection sensor
24, 26. magnets
30. coil

The invention claimed is:

1. A metal detection sensor for detecting metal contained in an object under inspection moving through a passageway, the sensor comprising:
   at least one magnet generating static magnetic field; and
   at least one magnetic-field sensor for detecting magnetic field generated by the metal, wherein:
   the magnet is located outside of the magnetic-field sensor along an axial direction perpendicular to a magnetic-field detection surface of the magnetic-field sensor; the magnetic-field sensor is located outside of the magnet along an axial direction connecting an N-pole and an S-pole of the magnet; and the magnet and the magnetic-field sensor are opposed to each other,
   wherein: the magnetic-field sensor, disposed outside the magnet along the axial direction connecting the N pole and the S pole of the magnet and opposed to the magnet, the magnet, disposed outside the magnetic field sensor along the axial direction of the magnetic-field sensor and opposed to the magnetic-field sensor, form a pair; and there are plurality of such pairs; the plural of pairs are disposed in parallel to or staggered from one another in a width direction of the passageway; and the plurality of pairs are spaced from an adjacent pair in the width direction of the passageway.

2. A metal detection sensor according to claim 1, wherein: the magnetic-field sensor is a solenoid coil; and the axial direction perpendicular to the magnetic-field detection surface of the magnetic-field sensor is an axial direction of the coil.

3. A metal detection sensor according to claim 2, wherein the coil has an iron core.

4. A metal detection sensor according to claim 1, wherein: the magnetic-field sensor is a spiral coil; the axial direction perpendicular to the magnetic-field detection surface of the magnetic-field sensor is the axial direction of the coil; and the spiral coil is a wire spirally wound in a plane perpendicular to the axial direction of the coil.

5. A metal detection sensor according to claim 1, wherein: the magnetic-field sensor comprises a pot-shaped iron core, a magnet placed at a center of the iron core, and a coil placed around the magnet; and the axial direction perpendicular to the magnetic-field detection surface of the magnetic-field sensor is the axial direction of the coil.

6. A metal detection sensor according to claim 1, wherein: there are a plurality of the magnet; the plurality of magnets are opposed across the passageway; and N-to-S poles orientations of the plurality of magnets coincide with each other.

7. A metal detection sensor according to claim 6, wherein the plurality of magnets are disposed on opposite sides of the magnetic sensor along the axial direction of the magnetic sensor.

8. A metal detection sensor according to claim 1, wherein:
   there are a plurality of the magnetic-field sensor; and the plurality of magnetic sensors are opposed across the passageway.

9. A metal detection sensor according to claim 8, wherein the plurality of magnetic-field sensors are disposed on opposite sides of the magnet along the axial direction connecting the N pole and the S pole of the magnet.

10. A metal detection sensor according to claim 1, wherein outputs of the plurality of magnetic-field sensors are individually processed, or the outputs of the plurality of magnetic-field sensors are connected in series.

11. A metal detection sensor according to claim 1, wherein: metal contained in an object under inspection is a metal generating a forward magnetic field or a metal generating a reverse magnetic field; the magnetic-field sensor outputs a signal that varies in polarity or magnitude, depending on whether metal detected by the magnetic-field sensor is a metal generating a forward magnetic field or a reverse magnetic field.

12. A metal detection sensor according to claim 1, wherein a shape of the magnet is a solid cylinder, a hollow tube, a polygonal column, a truncated pyramid, a parabolic cylinder, or a truncated cone.

13. A metal detection sensor according to claim 1, further comprising at least one magnetic-field sensor and at least one magnet that are disposed in a passageway where the object under inspection does not exist, wherein the magnetic-field, disposed in the passageway where the object under inspection does not exist, outputs a reference output indicative of a condition that the objection under inspection does not exist.

14. A metal detection method for detecting metal contained in an object under inspection moving through a passageway, using the metal detection sensor according to claim 13, comprising:
measuring the reference output;
measuring a detection output of the magnetic-field sensor disposed in a position where the object under inspection is present; and
calculating an output difference between the reference output and the detection output and determining that metal is contained in the object under inspection if the output difference is a predetermined value or greater.

15. A metal detection method for detecting metal contained in an object under inspection moving through a passageway, using the metal detection sensor according to claim 1, comprising:
measuring a reference output of the magnetic-field sensor when the object under inspection does not contain metal;
measuring a detection output of the magnetic-field sensor when there is a possibility of presence of metal in the object under inspection; and
calculating an output difference between the reference output and the detection output and determining that metal is contained in the object under inspection if the output difference is a predetermined value or greater.

16. A metal detection sensor according to claim 1, wherein the sensor detects speed of the metal.

17. A metal detection sensor for detecting metal contained in an object under inspection moving through a passageway, the sensor comprising:
first and second magnets generating static magnetic field; and
a first magnetic-field sensor for detecting magnetic field generated by the metal, wherein:
the first and second magnets are opposed on opposite sides of the passageway; the first magnet is disposed outside of the second magnet along an axial direction connecting an N pole and an S pole of the second magnet; and the second magnet is disposed outside of the first magnet along an axial direction connecting an N pole and an S pole of the first magnet;
the first magnetic-field sensor and the second magnet are opposed on opposite sides of the passageway; the first magnetic-field sensor is disposed outside of the second magnet along an axial direction connecting the N pole and the S pole of the second magnet; and the second magnet is disposed outside of the first magnetic-field sensor along an axial direction perpendicular to a magnetic-field detection surface of the first magnetic-field sensor;
the metal detection sensor comprises a magnetic member connecting poles of the first and second magnets located on opposite sides of the first and second magnets to the passageway;
the first magnet, disposed outside of the second magnet along the axial direction connecting the N pole and the S pole of the second magnet, the second magnet, disposed outside of the first magnet along the axial direction connecting the N pole and the S pole of the first magnet, and the magnetic-field sensor, disposed outside of the second magnet along the axial direction connecting the N pole and the S pole of the second magnet, form a set there are a plurality of such sets; and
the plurality of sets are disposed in parallel to or staggered from each other in a width direction of the passageway;
orientations of magnetic fields generated by adjacent sets are antiparallel to each other; and
the plurality of sets are spaced from an adjacent set in the width direction of the passageway.

18. A metal detection sensor according to claim 17, wherein the first magnetic-field sensor is a coil wound around an iron core or a magnet.

19. A metal detection sensor according to claim 17, comprising a second magnetic-field sensor, wherein
the second magnetic-field sensor and the first magnet are opposed on opposite sides of the passageway; the second magnetic-field sensor is disposed outside of the first magnet along the axial direction connecting the N pole and the S pole of the first magnet; and the first magnet is disposed outside the second magnetic-field sensor along an axial direction perpendicular to a magnetic-field detection surface of the second magnetic-field sensor.

20. A metal detection sensor according to claim 17, wherein the first magnetic-field sensor is a coil that is disposed on an outer circumference of the first magnet; and the second magnetic-field sensor is a coil that is disposed on an outer circumference of the second magnet.

21. A metal detection sensor according to claim 17, comprising at least either a first magnetic member interconnecting poles of adjacent first magnets located on opposite sides of the adjacent first magnets to the passageway or a second magnetic member interconnecting poles of adjacent second magnets located on opposite sides of the adjacent second magnets to the passageway.

22. A metal detection sensor for detecting metal contained in an object under inspection moving through a passageway, the metal detection sensor comprising:
a plurality of first magnets generating static magnetic field disposed on one side of the passageway; and
a first magnetic-field sensor for detecting magnetic field generated by the metal, wherein:
the plurality of first magnets are arranged in one row so that axes connecting N poles and S poles of the magnets align in the same direction; any two adjacent first magnets are so arranged that the polarity of a pole of one of the two magnets disposed on a side of the other magnet is the same as the polarity of a pole of the other magnet disposed on a side of said one of the two magnets; and the first magnetic-field sensor is disposed on an outer circumference of the first magnet in a direction of connecting the N-pole and the S-pole of the first magnet.

23. A metal detection sensor according to claim 22, wherein the first magnetic-field sensor is disposed on said one side of the passageway, the metal detection sensor comprising:
- a plurality of second magnets generating static magnetic field disposed on another side of the passageway; and
- a second magnetic-field sensor for detecting magnetic field generated by the metal, the second magnetic-field sensor being disposed on said another side of the passageway, wherein:
- the plurality of second magnets are arranged in one row so that axes connecting N poles and an S poles of the magnets align in the same direction; and any adjacent two second magnets are so arranged that the polarity of a pole of one of the adjacent second magnets, which pole is disposed on a side of the other second magnet, is the same as the polarity of a pole of the other second magnet, which pole is disposed on a side of said one of the adjacent second magnets.

24. A metal detection sensor according to claim 22, wherein the intensity of magnetic field generated by the magnet is set by a distance between the N pole and the S pole of the first magnet.

* * * * *